United States Patent
Oh et al.

(10) Patent No.: US 6,279,019 B1
(45) Date of Patent: Aug. 21, 2001

(54) DECIMATION FILTERING APPARATUS AND METHOD

(75) Inventors: Hyuk-Jun Oh, Seoul; Yong-Hoon Lee, Taejonkwangyok; Sun-Bin Kim; Gin-Kyu Choi, both of Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/224,811

(22) Filed: Dec. 31, 1998

(30) Foreign Application Priority Data

Dec. 31, 1997 (KR) .................................. 97-80782

(51) Int. Cl.$^7$ ............................. G06F 17/10; G06F 17/17
(52) U.S. Cl. .............................................. 708/300; 708/313
(58) Field of Search ................................... 708/300, 301, 708/303, 305, 306, 307, 313, 319; 341/143

(56) References Cited

U.S. PATENT DOCUMENTS

| | | | |
|---|---|---|---|
| 5,079,734 | * 1/1992 | Riley | 708/313 |
| 5,408,235 | * 4/1995 | Doyle et al. | 341/143 |
| 5,617,344 | 4/1997 | Young et al. | 364/724.1 |
| 5,621,675 | 4/1997 | Linz et al. | . |
| 5,646,621 | 7/1997 | Cabler et al. | . |
| 6,057,793 | * 5/2000 | Gong et al. | 341/143 |

* cited by examiner

*Primary Examiner*—Chuong Dinh Ngo
(74) *Attorney, Agent, or Firm*—Dilworth & Barrese, LLP

(57) ABSTRACT

A decimation filtering apparatus using interpolated second order polynomials compensates for a droop caused by a CIC (Cascaded Integrator-Comb) filter. The decimation filter includes a CIC decimation filter for decimation filtering the sampling signal to downconvert a sampling signal; an ISOP filter for monotonically increasing an output of the CIC decimation filter to compensate for a passband droop caused by the CIC decimation filter; a multistage halfband filter including at least one modified halfband filter for half-decimating a signal output from the ISOP filter, thereby downconverting the ISOP filter output signal; and a programmable FIR filter that compensates for a passband droop of a signal output from the multistage halfband filter.

27 Claims, 16 Drawing Sheets

DECIMATION FILTERING APPARATUS AND METHOD

BACKGROUND OF THE INVENTION

1. Field of the Invention

The present invention relates generally to a decimation filtering apparatus and method, and more particularly to a decimation filtering apparatus and method using interpolated second order polynomials (ISOPs).

2. Description of the Related Art

With the development of wideband analog-to-digital conversion (ADC) technology and fast digital signal processing (DSP) technology, it has become possible to perform sampling and digital signal processing at an Intermediate Frequency (IF) band as well as at baseband. The term "software radio system", as used herein, refers to a system which starts the digital signal processing at the IF or Radio Frequency (RF) levels.

A software radio system can effectively support multi-band, multi-mode and multi-function communications by virtue of the programmability of the digital signal processing software. For example, a base station of an AMPS (Advanced Mobile Phone Service) mobile communication system, having a structure illustrated in FIG. 1, provides 30 KHz channels to respective users, and employs RF and IF stage receivers for the respective channels. As shown in FIG. 2, a software radio system can perform a channel separating operation by using one wideband RF stage, one wideband ADC and N digital filters (where N is the number of the channels).

When such a software radio technique is applied to both a communication terminal (mobile station) and the base station in a mobile communication system, it is possible to accommodate the entire national and regional standards and provide a roaming service between different service areas. This software radio concept may be widely applied to the base stations and communication terminals of future mobile communication systems such as a PCS (Personal Communication System) and IMT-2000 (International Mobile Telecommunication) systems.

A software radio system should include a decimation filter, a rate converter, a fast multiplier and a trigonometrical function generator. A baseband stage of a software radio receiver should isolate a signal of interest, which is usually a very narrowband signal, from a wideband input signal. To this end, it is important to effectively design a fast decimation filter.

At present, known digital downconverters for a digital interface include model GC4014 manufactured by Gray Corporation, and models HSP50016 and HSP50214 manufactured by the Harris Corporation. A digital downconverter is also disclosed in a paper by Alan Y. Kwentus, Zhognong Jiang, and Alan N. Willson, Jr., "Application of Filter Sharpening to Cascaded Integrator-Comb Decimation Filters", IEEE Trans. Signal Processing, vol. 45, pp. 457–467, February 1997.

Among the above devices, model HSP50214 may be an improvement over models GC4014 and HSP50016. The device HSP50214 (hereafter referred to interchangeably as the '214 device or first prior art) has a three-stage structure of a Cascaded Integrator-Comb (CIC) filter, a halfband filter and a programmable Finite Impulse Response (FIR) filter. In the '214 device, the CIC filter is an Recursive Running Sum (RRS) filter used for decimation, which is relatively simple to implement. The halfband filter is a power-of-two decimating filter and half of the filter coefficients are "0", making it relatively simple to implement the hardware. That is, the '214 device primarily performs decimation by using the CIC filter, and then performs decimation at multiples of 2 using the halfband filter. In addition, the programmable FIR filter is used for compensating for a droop in the passband caused by the CIC filter.

Another prior art method (hereafter referred to interchangeably as the Willson method or second prior art) proposed in the paper by Willson Jr. uses a frequency response sharpening technique of Kaiser Hamming. The sharpening filter can remove the programmable FIR filter at the final stage in '214 device by decreasing attenuation of the passband in use. That is, the Willson method employs a two-stage structure of a sharpening filter and a halfband filter. When a CIC transfer function is H(z), a transfer function of the sharpening filter becomes $H^2(z)(3-2H(z))$.

A downconverter of the '214 device is composed of a CIC filter, a halfband filter and a programmable FIR filter. The CIC filter employed performs 4-to-32 decimation; the halfband filter performs 1-to-5 decimation; and the programmable FIR filter performs 1-to-16 decimation, so that the overall filter may perform 4-to-16384 decimation. However, since the halfband filter and the programmable FIR filter perform operations using one adder and one multiplier, an increase in the filtering operations may undesirably restrict the bandwidth of the signal for decimation. Moreover, since the passband droop of the CIC filter depends upon the programmable FIR filter at the final stage, the programmable FIR filter may be relatively complicated in structure.

In addition, the downconverter realized in accordance with the Willson method minimizes passband attenuation by applying the frequency response sharpening technique of Kaiser Hamming to the CIC filter, so as to remove the programmable FIR filter. However, for certain applications, the downconverter should still use a programmable FIR filter at the final stage for the overall device to perform satisfactorily. Furthermore, since the sharpening filter has the transfer function of $H^2(z)(3-2H(z))$, the downconverter may be as complicated as for the case in which three CIC filters are used.

The above-described prior art devices use a CIC filter with an RRS structure, which is most generally used in decimation applications and is generally simple to implement; but, the use of the CIC filter may cause the droop in the passband. To compensate for the droop, the '214 device uses only the programmable FIR filter at the final stage. As a result, the FIR filter may need a large number of taps, which makes it difficult to implement the filter. Moreover, the Willson device includes several CIC filters, as can be appreciated from the transfer function of the sharpening filter. Thus, it appears to be difficult to implement the Willson device. Further, for application to various systems, the Willson device also requires the programmable FIR filter at the final stage.

SUMMARY OF THE INVENTION

It is therefore an object of the present invention to provide a decimation filtering apparatus and method using interpolated second order polynomials.

It is another object of the present invention to provide an apparatus and method for implementing a downconverter of a software radio system by utilizing a decimation filter using interpolated second order polynomials.

It is still another object of the present invention to provide a decimation filtering apparatus and method for compensating for a droop caused by a CIC filter of a programmable downconverter of a software radio system by means of an Interpolated Second Order Polynomial (ISOP) filter, so as to reduce complexity of an FIR filter at a final stage.

It is further still another object of the present invention to provide a decimation filtering apparatus and method for compensating for a passband droop caused by a modified halfband filter by using an ISOP characteristic in a downconverter of a software radio system.

It is yet another object of the present invention to provide a decimation filtering apparatus and method which can reduce the number of taps of an FIR filter by using an unused modified halfband filter as a prefilter of a programmable FIR filter using a modified halfband filter with a multiplexer in a downconverter of a software radio system.

In an illustrative embodiment of the invention, there is provided a decimation filtering apparatus for decimating a sampling signal of a digital signal processing system. The decimation filtering apparatus includes a CIC decimation filter for decimation filtering the sampling signal to downconvert the sampling signal; an ISOP filter for monotonically increasing an output of the CIC decimation filter to compensate for a passband droop caused by the CIC decimation filter; a multistage halfband filter including at least one modified halfband filter for half-decimating a signal output from the ISOP filter, to thereby decimate the ISOP filter output signal; and a programmable FIR filter which compensates for a passband droop of the multistage halfband filter output signal.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings:

FIGS. 3A and 3B are diagrams illustrating structures of CIC decimation filters, wherein FIG. 3A illustrates a directly implemented RRS filter H(z), and FIG. 3B illustrates integrator and comb filter sections of the RRS filter separated by a decimator;

DETAILED DESCRIPTION OF CERTAIN PREFERRED EMBODIMENTS

Figure 1:
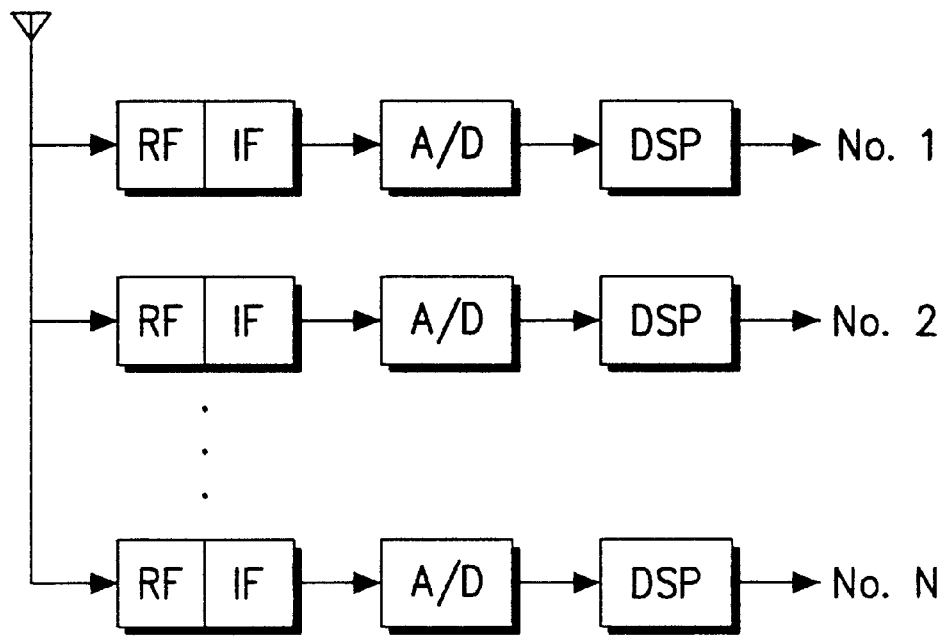
FIG. 1 is a block diagram of electronics within a general multi-protocol compatible communication terminal.
Figure 2:
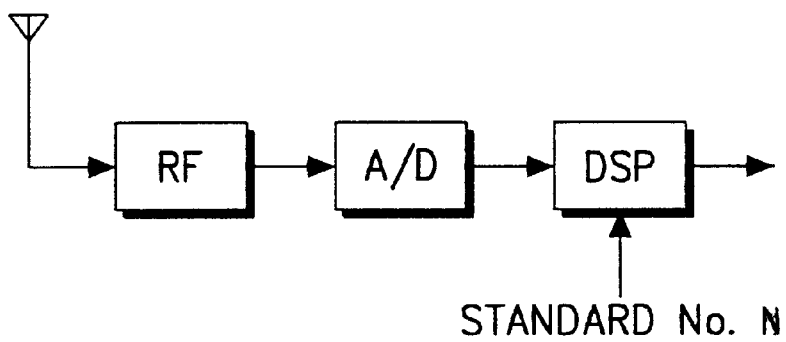
FIG. 2 is a block diagram illustrating electronics of a software radio device in a multi-protocol compatible communication terminal.

Preferred embodiments of the present invention will be described hereinbelow with reference to the accompanying drawings. In the following description, well known functions or constructions are not described in detail so as not to obscure the invention in unnecessary detail.

To provide a further foundation for the teachings of the present invention, certain aspects of CIC filters and halfband filters will first be discussed. Illustrative embodiments of the invention will then be described with reference to the drawings.

When a system application requires a decimation rate K, it should first be determined how a CIC filter and a modified halfband filter (MHBF) will perform decimation. Making this determination facilitates the analysis as to how a newly proposed structure will perform decimation. In this determination, since an increase in the number of the halfband filters may increase stopband attenuation, it is preferable to use available halfband filter resources to the extent possible. When the decimation performed in the CIC filter is M and the number of the halfband filters to be used is m, the decimation rat $K=M \times 2^m$.

The modified halfband filter is defined by a filter bank in accordance with the decimation rate K. Once the CIC filter and the halfband filter designs are determined in this manner, an ISOP filter and a programmable FIR filter should be designed next. A transfer function of the ISOP filter is $1+cz^{-I}+z^{-2I}$, the values c and I should be determined to design the ISOP filter. After determining the values c and I, it is possible to evaluate a value of the programmable FIR filter by linear programming. Here, the value I is set as $1 \leq I \leq [1/(2f_c)]$. If I=kM, $1 \leq k \leq [1/(2Mf_c)]$. Accordingly, it is possible to evaluate coefficients of a desired programmable FIR filter by using linear programming, taking the possible k and c values into consideration.

Though a general halfband filter should be symmetrically centered around ¼ (when 2π is 1), the MHBF not having such a shape should be designed such that passband attenuation decreases monotonically to obtain a desired stopband attenuation, because the ISOP increases monotonically, thereby compensating for the passband characteristics. Moreover, by using the MHBF as a prefilter, it is possible to reduce the complexity of the programmable FIR filter at the final stage.

One approach to efficient decimation filter design is based on the use of cascaded CIC decimation filter proposed by Hogenauer (see E. B. Hogenauer, "An Economical Class of Digital Filters for Decimation and Interpolation," IEEE Tr. Acoust., Speech, Signal Processing, vol. 29, pp. 155–162, April 1981). The programmable CIC filter is relatively simple to implement and can effectively reduce the aliasing effect caused by decimation. As pointed out in the second prior art, however, this filter tends to introduce droop in the passband of interest and can hardly isolate the passband because of its wide transition band. To overcome these difficulties, CIC filters are usually cascaded with a second decimating lowpass filter stage: programmable FIR (PFIR) filters are used for this stage.

In an attempt to avoid the use of a programmable filter at the second stage, the Willson method replaced the CIC filter with a sharpened CIC filter that can significantly reduce the passband droop caused by CIC filtering, and employed only fixed coefficient halfband filters at the second stage. By using programmable sharpened CIC filters, this decimation filter can isolate input signals with different bandwidth; but its application is rather limited. For example, it is not applicable to multi-protocol (i.e., multi-standard) communications in which decimation filters with different transition bandwidths are required. This is because the transition bandwidth provided by the fixed halfband filters of the prior art is fixed at a certain value.

In an embodiment of the present invention disclosed herein, there is provided a new CIC-based decimation filter as a useful alternative to the sharpened CIC filter. The proposed filter is a cascade of the CIC filter with the ISOP filter. This ISOP filter, which was developed for efficient digital filter design, can significantly reduce the passband droop of the CIC filter. By employing a simple ISOP filter after CIC filtering, the filters at the second stage of the decimation filter—such as halfband filters and programmable FIR filters—can be considerably simplified. Through some design examples, it will be understood that decimation filters with the ISOP filter can easily support multi-protocol communications and are simpler to implement than existing ones.

In the following description, the ISOP filter and its characteristics are first considered. Next, characteristics of the decimation filter employing a cascade of the CIC filter with the ISOP filter are considered. Finally, characteristics of the programmable downconverter for the mobile communication terminal are considered.

I. CIC DECIMATION FILTERS SHARPENED BY ISOPS

Figure 3A:
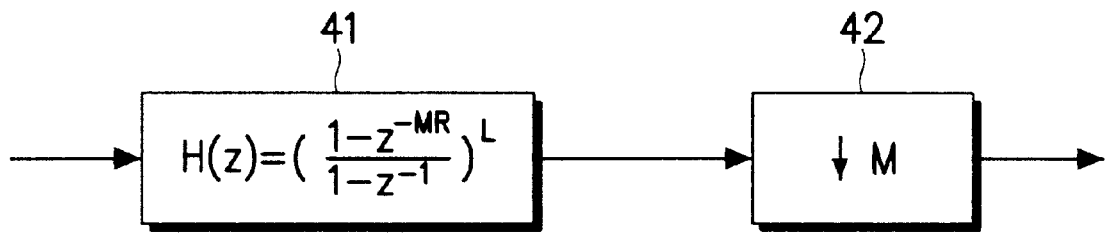
Figure 3B:
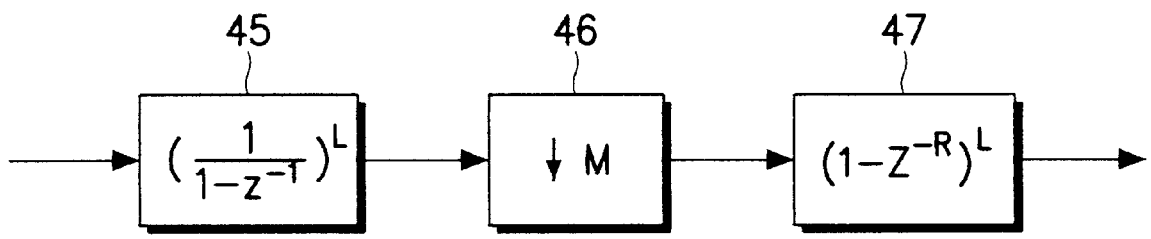

FIGS. 3A and 3B are diagrams illustrating structures of the CIC decimation filters, wherein FIG. 3A illustrates that an RRS filter H(z) is directly implemented, and FIG. 3B illustrates integrator and comb filter sections of the RRS filter separated by a decimator. Hereinbelow, the design of ISOP filters following CIC filters will be considered after briefly reviewing CIC and sharpened CIC filters.

A. CIC and Sharpened CIC Filters

The CIC decimation filter consists of cascaded RRS filters 41 followed by a decimator 42, as shown in FIG. 3A. The system function of the cascaded RRS filter is given by $$H(z) = \left(\frac{1}{MR} \frac{1 - z^{-MR}}{1 - z^{-1}}\right)^L \quad (1)$$

were M is an integer decimation factor, and R which is called a differential delay is a positive integer. In equation (1), the denominator and numerator terms of H(z) are referred to as an integrator and a comb filter, respectively. When implementing the CIC filters, the integrator 45 and comb filter 47 are separated by the decimator, as shown in FIG. 3B, to reduce computational load. The frequency response of H(z) is written as $$H(e^{j\omega}) = \left(\frac{1}{MR} \frac{1 - e^{-jMR\omega}}{1 - e^{j\omega}}\right)^L \quad (2)$$

Figure 4:
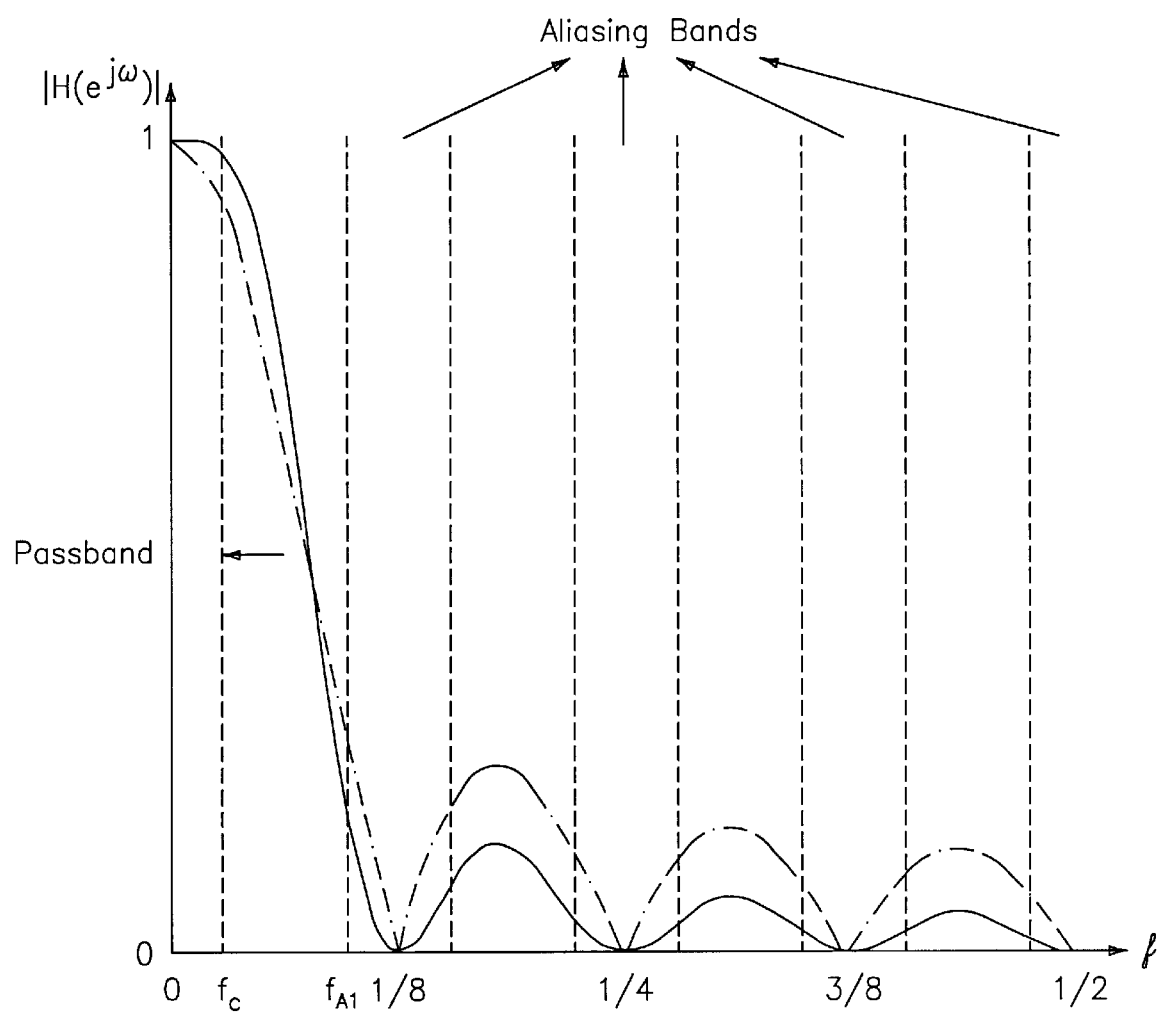
FIG. 4 is a diagram illustrating frequency response characteristics of the CIC filter.

This frequency response has nulls at multiples of f=1/MR, as shown in FIG. 4. These nulls provide natural attenuation of aliasing caused by the M-fold decimation, since the frequency bands that are folded into the baseband by the decimation are centered around the nulls at multiples of f=1/M. The worst case aliasing occurs at the lower edge of the first aliasing band at $f_{Al}$=1/M−$f_c$ where $f_c$ is the passband width.

The sharpened CIC filter is derived by replacing H(z) of the CIC filter in FIG. 3A with a sharpened filter $H_s(z)$=$H^2(z)[(3-2H(z))]$, which requires three CIC filters. In the second prior art, only those CIC filters with an even L and R=1 are considered. The sharpening characteristic at passband is degraded if R is increasing; and an even L value is required to keep integer group delay. This sharpening can significantly reduce the passband droop and improve aliasing rejection, as can be seen in FIG. 4. The implementation of $H_s(z)$ is of course considerably expensive than that of H(z). Next, there will be introduced a simpler and more flexible sharpening technique than the sharpened CIC filter.

B. The CIC Filter Cascaded with the ISOP Filter

In accordance with the invention, a simpler and more flexible sharpening technique than the sharpened CIC filter will now be described in reference to FIG. 6. As illustrated, CIC filter 51 is cascaded with the ISOP filter 53. The system function of the ISOP filter 53, P(z) is defined as $$P(z) = \frac{1}{|c+2|}(1 + cz^{-I} + z^{-2I}) \quad (3)$$

where I is a positive integer, and c is a real number. P(z) is an interpolated version of the second order polynomial $$S(z) = \frac{1}{|c+2|}(1 + cz^{-1} + z^{-2}) \quad (4)$$

This polynomial has the following property, which is simple but is useful for filter sharpening.

Property

When c is real, the magnitude response of the polynomial S(z) is expressed as $$|S(e^{j\omega})| = \frac{1}{|c+2|}|c + 2\cos\omega| \quad (5)$$

and is monotonically increasing in $\omega \in [0,\pi]$ if c<−2. Due to the scaling factor 1/|c+2|, the DC gain is always one, and the slope of the magnitude response varies depending on a parameter c.

The filter sharpening characteristic of the ISOP filter 53 stems from this property. The magnitude response of the ISOP filter 53 is given by $$|P(e^{j\omega})| = \frac{1}{|c+2|}|c + 2\cos I\omega| \qquad (6)$$

This is monotonically increasing in $\omega\epsilon[0,\pi/I]$ and is periodic with period $2\pi/I$. The ISOP filter 53 can compensate for the passband droop of the CIC filter 51, which is monotonically decreasing, in the frequency range $\omega\epsilon[0,\pi/I]$. To make proper compensation for the passband droop, it is suggested that the width of the monotonically increasing region $\omega\epsilon[0,\pi/I]$ coincides with the input bandwidth $2\pi f_c$. This means that $I=1/(2f)_c$. In designing ISOPs, it would be sufficient to consider only those I values satisfying $$1 \leq I \leq \left\lceil \frac{1}{2f_c} \right\rceil \qquad (7)$$

If I is set as I=kM, for a positive integer k, then the minima of the ISOP magnitude response occur at multiples of $f=1/kM$. In this case, the location of every k-th minimum coincides with those of the CIC nulls at which aliasing bands are centered, and thus the aliasing rejection characteristic of the CIC decimation filter can be retained after ISOP filtering. When I=kM, the equation (7) becomes $$1 \leq k \leq \left\lceil \frac{1}{2Mf_c} \right\rceil \qquad (8)$$

for a given M.

Figure 5:
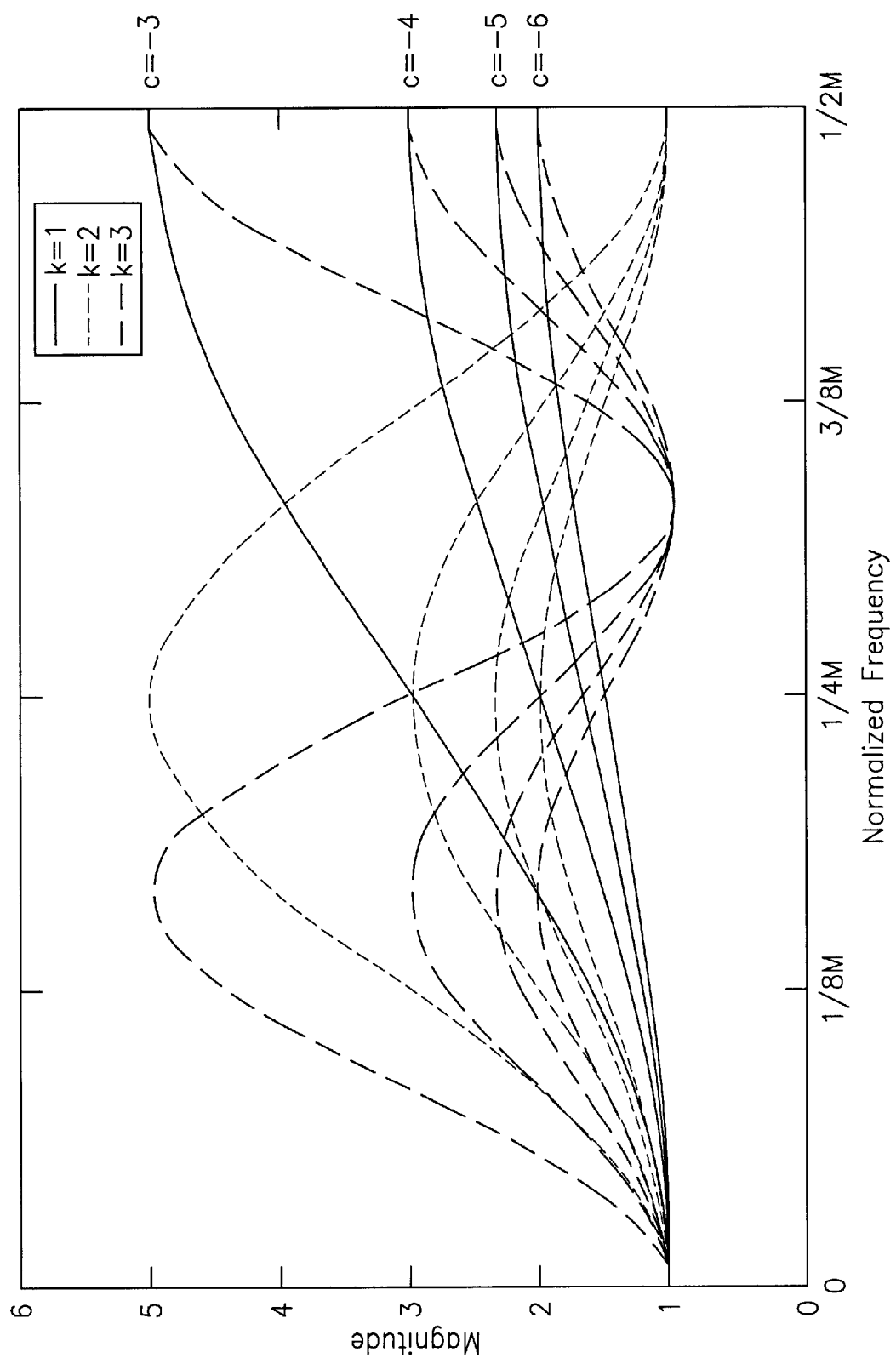
FIG. 5 is a diagram illustrating magnitude response characteristics of P(z), when c<-2.

FIG. 5 illustrates the magnitude response of $|P(e^{j\omega})|$ for several values of k and c<-2. It should be noted that the slope of $|P(e^{j\omega})|$ tends to increase as $|c|$ is decreased and as k is increased. The maximum and minimum values of $|P(e^{j\omega})|$, that can be obtained from equation (6), are $(|c|+2)/(|c|-2)$ and 1, respectively.

Figure 6:
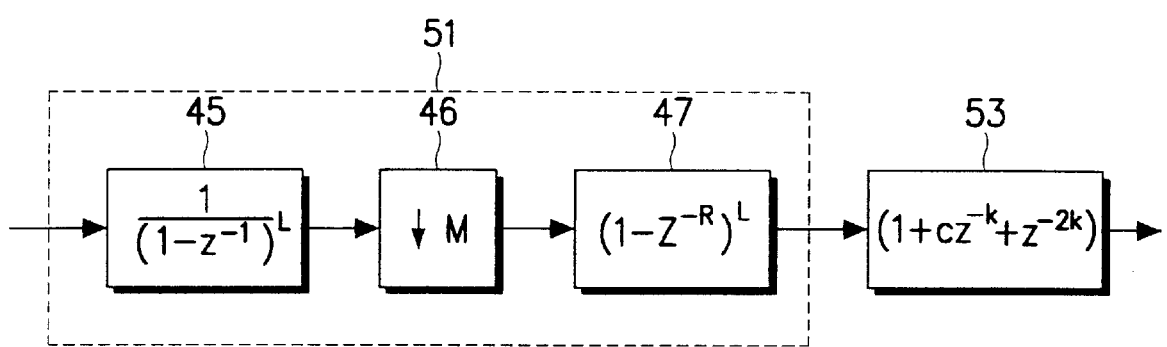
FIG. 6 is a diagram illustrating a structure of a CIC decimation filter cascaded with an ISOP filter in accordance with an embodiment of the present invention.

FIG. 6 illustrates the cascade of the CIC filter 51 and the ISOP filter 53. For this cascade, if the CIC filter 51 is given, an optimal ISOP can be designed by using conventional filter design methods such as the modified Parks-McClellan method (see, e.g., J. H. McClellan, T. W. Parks and L. R. Rabiner, "A Computer Program for Designing Optimum FIR Linear Phase Digital Filters," IEEE Tr. Audio Electroacoust., vol. 21, pp. 506–526, December 1973; see also, J. W. Adams and A. N. Willson, Jr. "A New Approach to FIR Filters with Fewer Multiplier and Reduced Sensitivity," IEEE Tr. Circuits and Syst., vol. 30, pp. 277–283, May 1983). Another suitable filter design method for the optimal ISOP design is the linear programming method (see, e.g., L. R. Rabiner, "Linear Program Design of Finite Impulse Response (FIR) Digital Filters," IEEE Tr. Audio Electroacoust., vol. 20, pp. 280–288, October 1972; or Y. C. Lim and S. R. Parker, "FIR filter design over a discrete power-of-two coefficient space," IEEE Tr. Acoust. Speech, Signal Processing, vol. 31, pp. 583–591, April 1983).

Specifically, for each integer k satisfying the equation (8), the following is solved minimize $\delta$ subject to $|H(e^{j\omega}) \cdot P(e^{j\omega})-1|<\delta$, for $0 \leq \omega \leq 2\pi f_c$ (9)

where $H(e^{j\omega})$ and $P(e^{j\omega})$ are frequency responses of the CIC filter 51 and the ISOP filter 53, respectively. Given $H(e^{j\omega})$, an optimal $P(e^{j\omega})$ minimizing $\delta$ can be obtained in a straightforward manner. After solving the equation (9) for each k, a (k,c) pair associated with the smallest $\delta$ is chosen.

To examine the performance characteristic of the cascaded filter according to the present invention, this filter was designed for several values of L, R and the input bandwidth $f_c$, and compared with the CIC and sharpened CIC filters. The results are summarized in Table 1.

TABLE 1

| Filters with M = 8 | | $f_c$ = ⅛ M | | $f_c$ = ¼ M | |
|---|---|---|---|---|---|
| | | Passband droop (dB) | Aliasing attenuation (dB) | Passband droop (dB) | Aliasing attenuation (dB) |
| Cascaded | L = 4, R = 1 | 0.0248 | 66.96 | 0.41 | 38.14 |
| | L = 4, R = 2 | 0.26 | 67.70 | 4.53 | 42.25 |
| | L = 6, R = 1 | 0.046 | 100.45 | 0.754 | 57.33 |
| | L = 6, R = 2 | 0.535 | 100.94 | 8.78 | 65.36 |
| CIC | L = 4, R = 1 | 0.88 | 67.82 | 3.59 | 41.32 |
| | L = 4, R = 2 | 3.64 | 70.58 | 15.64 | 53.36 |
| | L = 6, R = 1 | 1.33 | 101.73 | 5.39 | 61.97 |
| | L = 6, R = 2 | 5.45 | 105.86 | 23.45 | 80.04 |
| Sharpened CIC | L = 2, R = 1 | 0.062 | 58.40 | 0.84 | 32.33 |
| | L = 4, R = 1 | 0.231 | 126.10 | 2.692 | 73.14 |

Table 1 shows the passband droop and aliasing attenuation of the cascaded, CIC and sharpened CIC filters. In Table 1, as L and R are increased, aliasing attenuation of these three filters is improved, but their passband droop is also increased. Both the cascaded and the sharpened filters reduce passband droop of CIC filtering at the expense of some degradation in aliasing rejection; between these two, the former can perform better than the latter. As an example, consider the cascaded filter with L=6 and R=1, and the sharpened CIC filter with L=2 and R=1. These filters employ the same number of RRS filters, and their computational complexities are almost identical. It is seen from Table 1 that the cascaded filter is better than the sharpened CIC filter in reducing both passband droop and aliasing rejection. The cascade of the CIC filter 51 and the ISOP filters 53, which has a very simple architecture, is a useful alternative to the sharpened CIC decimation filters.

C. ISOP Filters Sharpening Modified Halfband Filters

Figure 7:
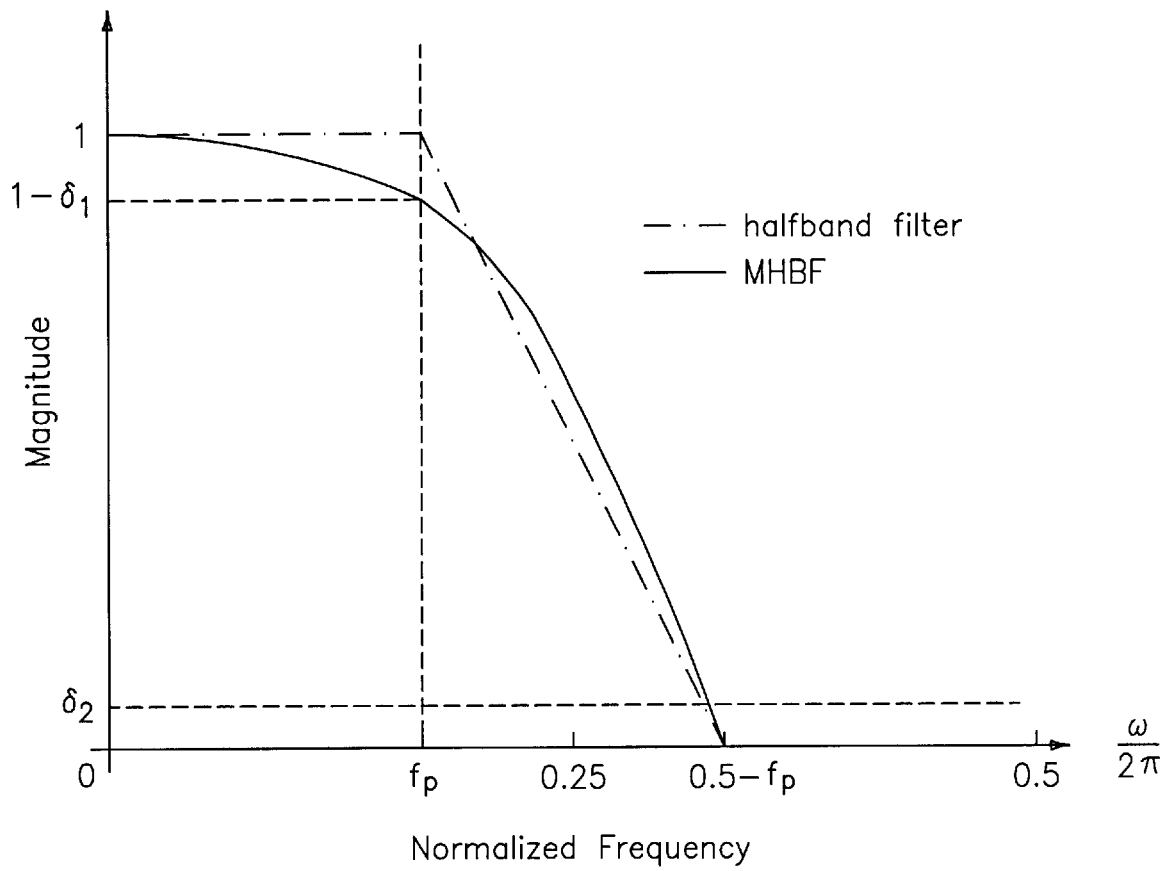
FIG. 7 is a diagram illustrating magnitude response characteristics of a halfband filter and a modified halfband filter.

As mentioned previously, CIC decimation filters are usually followed by fixed halfband filters whose magnitude responses are symmetric with respect to f=0.25. When the ISOP filter 53 is employed, it is possible to relax the symmetry requirements of the halfband filters by utilizing the sharpening characteristic of ISOP filtering. For example, a lowpass filter with the following specification can be used in place of a halfband filter:

passband: $f\epsilon[0 f_p]$ stopband: $f\epsilon[0.5-f_p, 0.5]$ (10)

ripple: $\delta_1$ and $\delta_2$ for passband and stopband, respectively. $\delta_1 >> \delta_2$ condition: magnitude response is monotonically decreasing in passband This lowpass filter, which will be referred to as the modified halfband filter (MHBF), has an asymmetric magnitude response as shown in FIG. 7. The magnitude responses of the halfband filter and the MHBF are shown, wherein a dot-dash line denotes a characteristic curve of the halfband filter and a solid line denotes a characteristic curve of the MHBF. Since the magnitude response of the MHBF is monotonically decreasing in the passband, the passband ripple $\delta_1$ becomes passband droop that can be reduced by ISOP filtering. An MHBF with frequency response $A(e^{j\omega})$ is designed as follows:

$$\begin{aligned} &\text{minimize } \delta_1 \\ &\text{subject to } |A(e^{j\omega})| < \delta_2 \quad \text{(in stopband)} \\ &\quad |A(e^{j\omega})| \text{ is monotonic (in passband)} \end{aligned} \quad (11)$$

This problem can be solved by linear programming. When MHBFs are employed after the cascade of the CIC filter 51 and the ISOP filter 53, the ISOP should reduce the passband droop of the MHBFs as well as that of the CIC filter. Such an ISOP can be designed in accordance with equation (9). Details of designing the ISOP filters will be presented again hereinbelow, when describing the overall decimation filter design. It will be shown that the implementation of an MHBF can be considerably simpler than that of a halfband filter despite the fact that most coefficients of an MHBF are non-zero. In conventional halfband filtering, about half of the filter coefficients are zero.

II. OVERALL DECIMATION FILTER DESIGN

Figure 8:
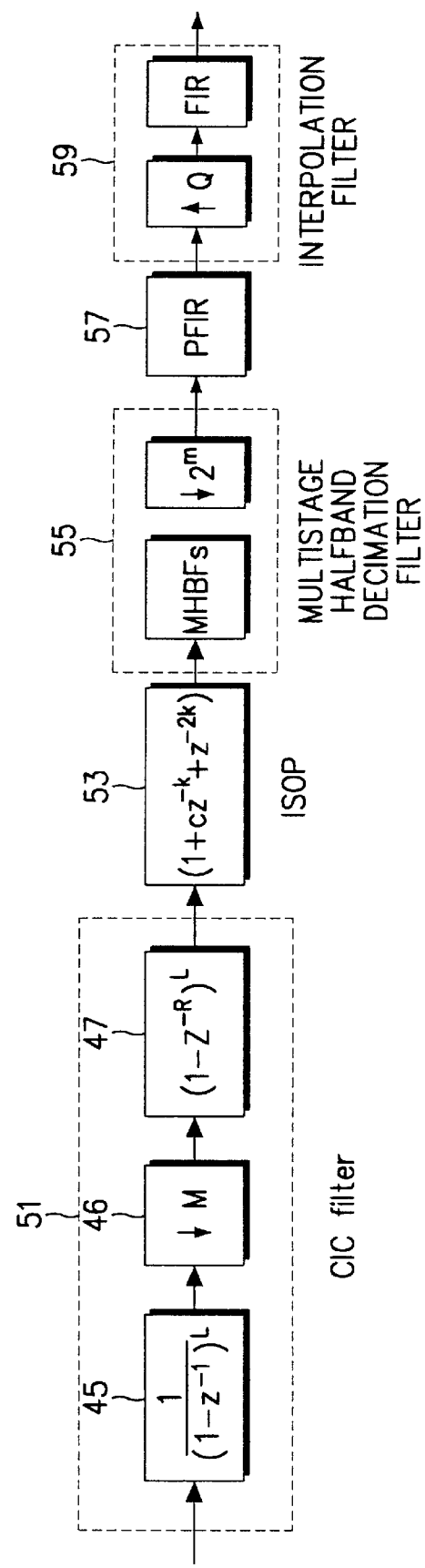
FIG. 8 is a diagram illustrating a structure of a programmable decimation filter.

FIG. 8 illustrates a structure of a programmable decimation filter according to an embodiment of the present invention, wherein $F_s$ denotes an input sampling frequency and m denotes the stage number of the halfband filters. Reference will be made to an architecture of an overall decimation filter employing the cascade of the CIC filter 51 and the ISOP filter 53 with reference to FIG. 8. The filters following the ISOP filter 53 consist of a multistage halfband decimation filter 55, a PFIR filter 57 and an interpolation filter 59.

Figure 9:
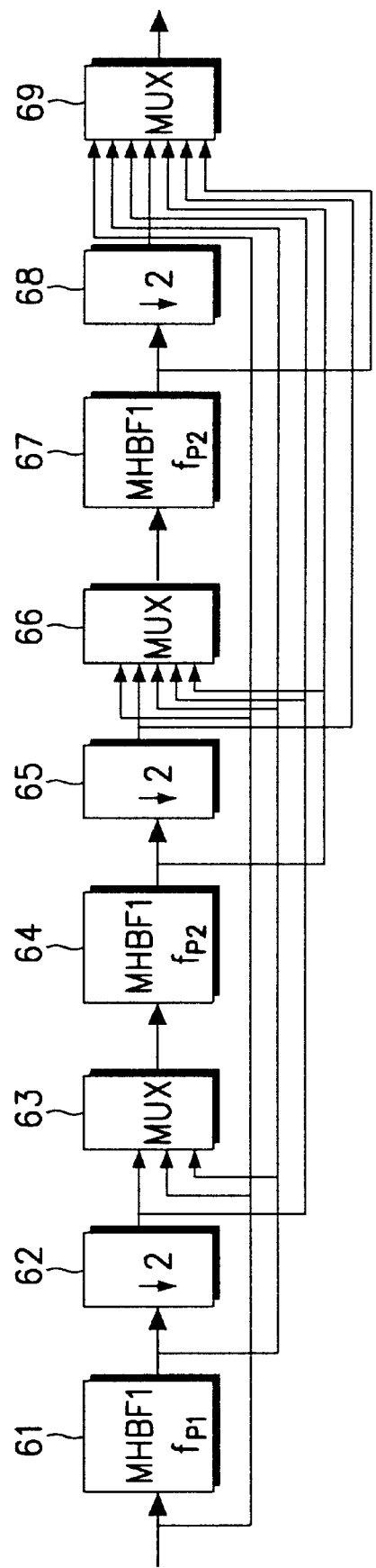
FIG. 9 is a diagram illustrating a structure of a multi-stage halfband decimation filter.

FIG. 9 illustrates a structure of the multistage halfband decimation filter 55 which is a cascade of decimation filters consisting of MHBFs 61, 64 and 67 followed by 2-to-1 decimators 62, 65 and 68. The MHBFs 61, 64 and 67 have fixed coefficients and are reasonably simple to implement, especially in dedicated hardware, because multiplier-less implementation is possible by using techniques such as canonical signed digit (CSD) coefficients design (see Y. C. Lim and S. R. Parker, "FIR filter design over a discrete power-of-two coefficient space," IEEE Tr. Acoust. Speech, Signal Processing, vol. 31, pp. 583–591, April 1983) (see also H. Samueli, "An improved search algorithm for the design of multiplier-less FIR filters with power-of-two coefficients," IEEE Tr. Circuits syst., vol. 36, pp. 1044–1047, July 1989). The PFIR filter 57 provides flexibility for multi-standard communication applications. Its implementation is often costly, because it tends to have long impulse response and due to its programmability, multiplier-less implementation is not recommended for this case. Therefore, it is usually desirable to lower the input rate of the PFIR filter 57 as much as possible. The interpolation filter 59, which is sometimes optional, is used for adjusting the output sampling rate to a desired rate. In the following description, some details for designing each of these filters will be presented.

Multistage Halfband Decimation Filter Design

Let the total number of available MHBFs be J. These filters are ordered such that $f_{p1} < f_{p2} < \ldots < f_{pJ}$ where $f_{pi}$ is the bandwidth of the i-th MHBF. When designing the multistage decimator for a given application, m out of J MHBF stages are selected depending on the bandwidth $Mf_c$, which is the output bandwidth of the CIC filter 51. To be specific, the index of the selected MHBFs is denoted by $s(i)$, $1 \leq i \leq m$ where $s(i) \in \{1, 2, \ldots, J\}$. It is assumed that $s(1) < s(2) < \ldots s(m)$. Then, their bandwidth $f_{ps(i)}$ should meet $$f_{P_{S(i)}} > 2^{i-1} Mf_c, \text{ for all } 1 \leq i \leq m \quad (12)$$

The reason for the latter is stated as follows: The firstly chosen MHBF should pass the input signal with bandwidth $Mf_c$. Thus $f_{ps(1)} > Mf_c$. After 2-to-1 decimation, the bandwidth of the input to the secondly chosen MHBF becomes $2Mf_c$, and thus the filter bandwidth $f_{ps(2)}$ should be lager than $2Mf_c$. The rest can be proved in the same manner. The decimation rate provided by the multistage halfband decimation is $2^m$. An MHBF which is not selected but has bandwidth larger than $f_{ps(m)}$ can serve as a prefilter preceding the PFIR filter, after removing the 2-to-1 decimator following it. The role of the prefilter is to reduce the computational burden of the PFIR filter 57. For example, in FIG. 9, the MHBF1 and MHBF2 can be used with their 2-to-1 decimators (m=2), and the MHBF3 can be used as a prefilter without its decimator.

Determination of Decimation Factors M and $2^m$

Given the desired decimation rate, say D, of the overall filter, it is necessary to determine proper m and M satisfying $D=2^m M (D < F_s/2f_c)$. A rule of thumb for this purpose is to use as many MHBF stages as possible. By increasing the number of MHBF stages m, stopband attenuation of the multistage halfband decimation filer is improved, and thus the complexity of the PFIR filter 57 can be reduced. Furthermore, since M is decreased as m is increased, aliasing attenuation of the CIC filter 51 is improved. Therefore, it is recommended to determine m by counting the number of MHBFs satisfying the condition in equation (12). Once m is decided, M is given by $M=D/2^m$. When the desired decimation factor D is odd, m is set at zero. In this case, one may consider a decimation factor $2^n D$ for a small positive integer n, instead of D. This is possible since the interpolation filter 59 following the PFIR filter 57 can compensate for the additional $2^n$-to-1 decimation.

CIC Filter Design

For a given decimation rate M, the differential delay R and the number of RRS stages L are determined such that the desired aliasing attenuation is met. Unlike the conventional CIC filter design, it is unnecessary to pay attention to the passband droop of the CIC filter 51 while deciding L and R, because most passband droop can be reduced by the ISOP filter 53.

Simultaneous Design of ISOP and PFIR Filters

After completing the design of the CIC filter 51 and the multistage halfband decimation filter 55, the ISOP filter 53 and the PFIR filter 57 can be simultaneously designed so that the overall decimation filter meets given specifications. A procedure for designing these filters can be developed by extending the ISOP design problem in equation (9). Since the overall filter is conveniently specified with frequencies normalized by $F_s$, which is the input rate of the CIC filter 51, the design problem is formulated with such normalized frequencies. Let $G(e^{j\omega})$ denote the frequency response of the cascaded CIC and multistage halfband decimation filters, and $H_d(e^{j\omega})$ denote the desired frequency response of the overall decimation filter. In evaluating $G(e^{j\omega})$, decimation factors associated with it should be carefully considered. For example, when the number of selected MHBF stages is three (m=3), $G(e^{j\omega})$ is expressed as $$G(e^{j\omega}) = H(e^{j\omega}) A_{S(1)}(e^{jM\omega}) A_{S(2)}(e^{j2M\omega}) A_{S(3)}(e^{j4M\omega}) \quad (13)$$

where the first term on the right is the frequency response of the CIC filter 51 in equation (2), and $A_{s(i)}(e^{j2^{i-1}M\omega})$ is the frequency response of the i-th selected MHBF with a decimation rate $2^i M$. Considering decimation factors, the frequency response of the PFIR filter 57 should be written in the form $F(e^{j2^m M\omega})$. The invention aims to minimize the complexity of the PFIR filter 57 under given filter specifications. Specifically, it is needed to consider the following optimization problem.

minize number of taps for *PFIR* filtering (14)

subject to $|G(e^{j\omega})P(e^{j\omega})F(e^{j2^m M\omega}) - H_d(e^{j\omega})| < \delta_p$ (in passbands)

$|G(e^{j\omega})P(e^{j\omega})F(e^{j2^m M\omega})| < \delta_s$ (in stopbands)

where $\delta_p$ and $\delta_s$ denote passband and stopband ripples, respectively; $P(e^{j\omega})$ is the frequency response of the ISOP filters in equation (6); and $H_d(e^{j\omega})$ is assumed to be zero in stopbands. The passband is given by $f \in \{0, f_c\}$ where $f_c$ is the signal bandwidth (see FIG. 4). The problem in equation (14) can be solved by linear programming, once $G(e^{j\omega})$, c and k are given. In the embodiment, $G(e^{j\omega})$ is given, but k and c are the ISOP parameters to be determined. To find proper values of k and c, there are proposed some exhaustive search: consider all possible (k,c) values; and for each (k,c) pair the optimization problem in equation (14) is solved by linear programming: then a (k,c) pair associated with the optimal solution is chosen. This completes the design of both the ISOP and PFIR filters 53 and 57. Considering all k in the range given by equation (8) is not a difficult task. On the other hand, search for a real value c is rather difficult. A useful search range for c is given by $c_0 < c < -2$ (15)

where $c_0$ is the optimal c value obtained by solving the ISOP design problem in equation (9). A rationale for this is as follows: the ISOP filter 53 should compensate for an additional passband droop caused by MHBFs, as compared with the ISOP in section I. B; the inequality in equation (15) follows from the observation that the slope of $|P(e^{j\omega})|$ tends to increase as $|c|$ is decreased (see FIG. 5).

In the following description, it will be observed that the time required for designing the ISOP and PFIR filters 53 and 57 by the proposed method is not excessive in practical applications.

III. DESIGN EXAMPLES

Two examples illustrating the procedure for designing the proposed decimation filter will be presented. In the first example, filter specifications in the '214 device are considered; and in the second, specifications suitable for PDC of the IS-95 mobile communication system (see T. S. Rappaport, Wireless Communications, Prentice Hall Inc., Upper Saddle River, N.J., 1996) are specified and a decimation filter for IS-95 is designed. For multi-standard communication, it is assumed that the input sampling frequency $F_s$ can be adjusted so as to maintain an integer decimation factor D. When this is impossible, an additional sampling rate converter proposed by Gardner (see F. M. Gardner, "Interpolation in digital models-Part I: Fundamentals," IEEE Tr. Comm., vol. 41, pp. 501–507, March 1993) would be necessary.

Figure 10:
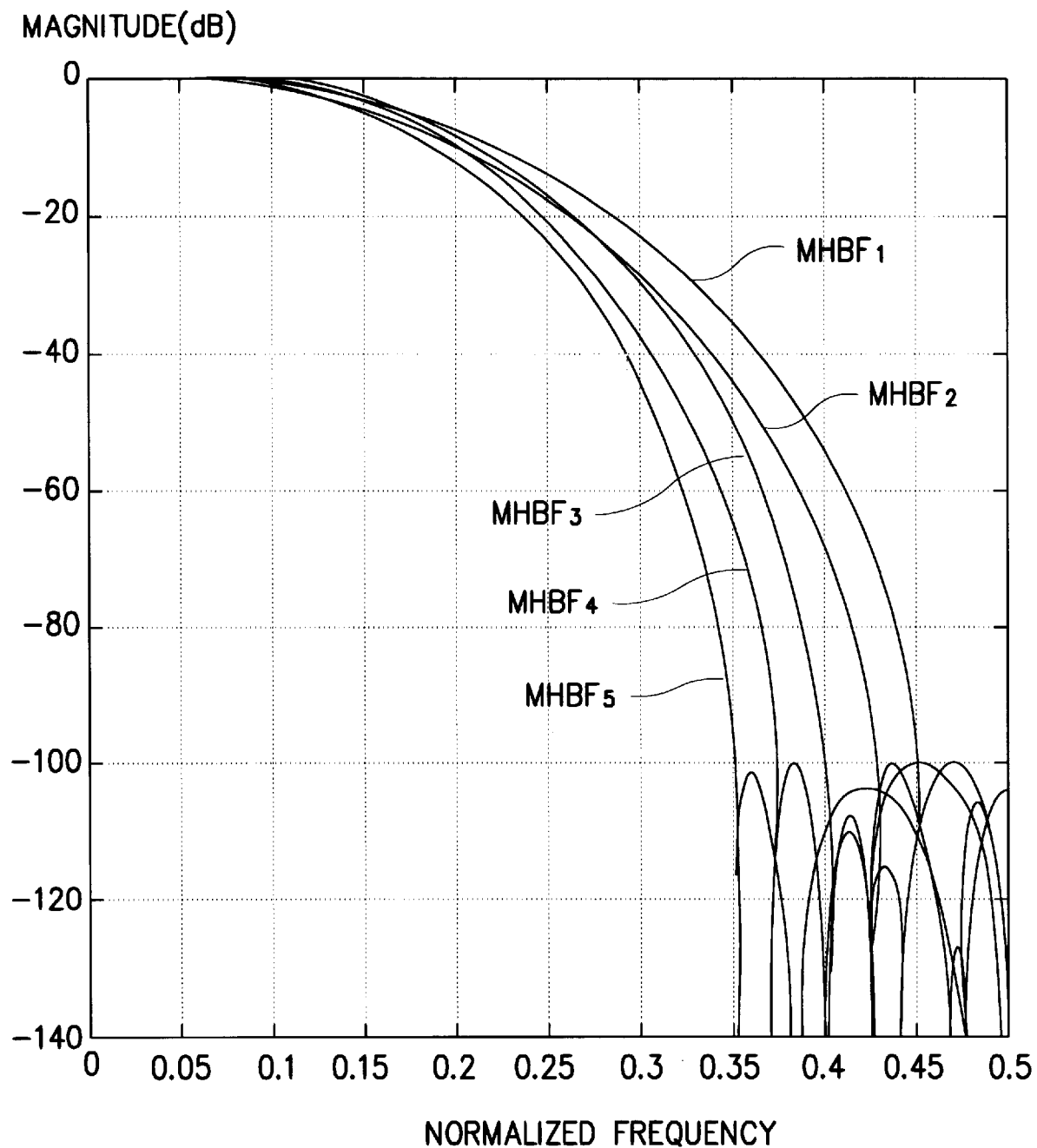
FIG. 10 is a diagram illustrating magnitude response characteristics of the modified halfband filters.

The structure of an embodiment of the present invention will be compared with the one in the first prior art consisting of the CIC filter with R=1, five halfband filters and the PFIR filter 57. The embodiment employs five MHBFs (J=5) having CSD coefficients that can be expressed as sums and differences of two powers-of-two terms with 9-bit resolution. These MHBFs were designed in the cascade form by linear programming for $fp \in \{0.05, 0.075, 0.1, 0.125, 0.15\}$, and $\delta_2 = 0.00001$ (see equation (10)). The magnitude response and the coefficients of these filters are shown in FIG. 10 and Table 2, respectively. The implementation of MHBFs in dedicated hardware is very simple. For example, MHBF5 in Table 2 which is the most complex among the five requires 19 adders and 13 shifters. This hardware complexity typically corresponds to a few multipliers.

TABLE 2

| | |
|---|---|
| MHBF1 | $2^{-1}[2^{-2} + (2^{-1} - 2^{-7})z^{-1} + 2^{-2}z^{-2}][2^{-2} + 2^{-6} + (2^{-1} + 2^{-7})z^{-1} + (2^{-2} + 2^{-6})z^{-2}][1 + z^{-1}]$ |
| MHBF2 | $[2^{-2} + 2^{-4} + (2^{-1} + 2^{-4})z^{-1} + (2^{-2} + 2^{-4})z^{-2}][2^{-2} + 2^{-6} + (2^{-1} + 2^{-6})z^{-1} + (2^{-2} + 2^{-6})z^{-2}][2^{-2} + 2^{-7} + (2^{-1} + 2^{-7})z^{-1} + (2^{-2} + 2^{-7})z^{-2}]$ |
| MHBF3 | $[2^{-2} + (2^{-1} - 2^{-5})z^{-1} + 2^{-2}z^{-2}][2^{-2} + 2^{-4} + (2^{-1} + 2^{-6})z^{-1} + (2^{-2} + 2^{-4})z^{-2}][2^{-2} + 2^{-5} + 2^{-1}z^{-1} + (2^{-2} + 2^{-5})z^{-2}][1 + z^{-1}][2^{-4} - 2^{-1}z^{-2} + 2^{-4})z^{-4}]$ |
| MHBF4 | $2^{-2}[2^{-1} - 2^{-4} + (2^{-1} + 2^{-3})z^{-1} + (2^{-1} - 2^{-4})z^{-2}][2^{-2} + 2^{-4} + (2^{-1} + 2^{-7})z^{-1} + (2^{-2} + 2^{-4})z^{-2}][2^{-2} + 2^{-5} + 2^{-1}z^{-1} + (2^{-2} + 2^{-5})z^{-2}][1 + z^{-1}]^2[2^{-3} - (2^{-1} + 2^{-2})z^{-1} + 2^{-3}z^{-2}]$ |
| MHBF5 | $2^{-3}[2^{-1} + 2^{-3} + (2^{-1} + 2^{-2})z^{-1} + (2^{-1} + 2^{-3})z^{-2}][2^{-2} + (2^{-2} + 2^{-3})z^{-1} + 2^{-2}z^{-2}]^2[1 + z^{-1}]^2[2^{-2} + 2^{-5} - (2^{-1} + 2^{-2})z^{-1} + (2^{-2} + 2^{-5})z^{-2}]$ |

EXAMPLE 1

The specifications considered in designing a decimation filter in the first prior art (the '214 device) are as follows:

sampling rate: $F_s$=39 Msps passband edge: 90 KHz from the carrier (16)

stopband edge: 115 KHz from the carrier desired decimation rate: D=72

In normalized frequencies, these correspond to passband: $f \in [0, 0.0023]$ stopband: $f \in [0.0029, 0.5]$ (17)

The decimation filter designed in the first prior art consists of a CIC filter 51 with M=18, L=5, and R=1, two halfband filters (m=2) and a 90 tap PFIR filter with even symmetric coefficients. The passband ripple and stopband attenuation that can be achieved by the decimation filter are:

passband ripple: 0.18 dB stopband attenuation: 108 dB (18)

The design of another decimation filter under the specifications in equations (16), (17) and (18), following the procedure stated above, will now be presented.

Multistage Halfband Decimation Filter Design

Since D=72=$2^3 \times 9$, the number of halfband stages m≦3. All the MHBFs in FIG. 10 satisfy equation (12). Among these, MHBF5 is used as a prefilter, and MHBF1, MHBF2 and MHBF4 are selected to form three stage (m=3) halfband decimation filters. This is because MHBF5 has wider stopband than the others, and the cascade of MHBF1, MHBF2 and MHBF4 causes least passband droop while providing 120 dB stopband attenuation.

CIC Filter Design

Since D=72 and m=3, the CIC decimation factor M should be 9. In the embodiment, L=4 and R=1. The CIC filter with these parameters provides 133.3 dB aliasing attenuation.

ISOP and PFIR Filter Design

Given the CIC filter 51 and the MHBFs, equation (14) was solved by using a linear programming package (see Matlab Reference Guide, The Math Works Inc., 1995). The total design time in a personal computer with a Pentium 200 MHz processor was less than two hours. The optimization results in ISOP parameters (k,c)=(19,−2.4481) and a 69 tap odd symmetric PFIR filter.

Figure 11:
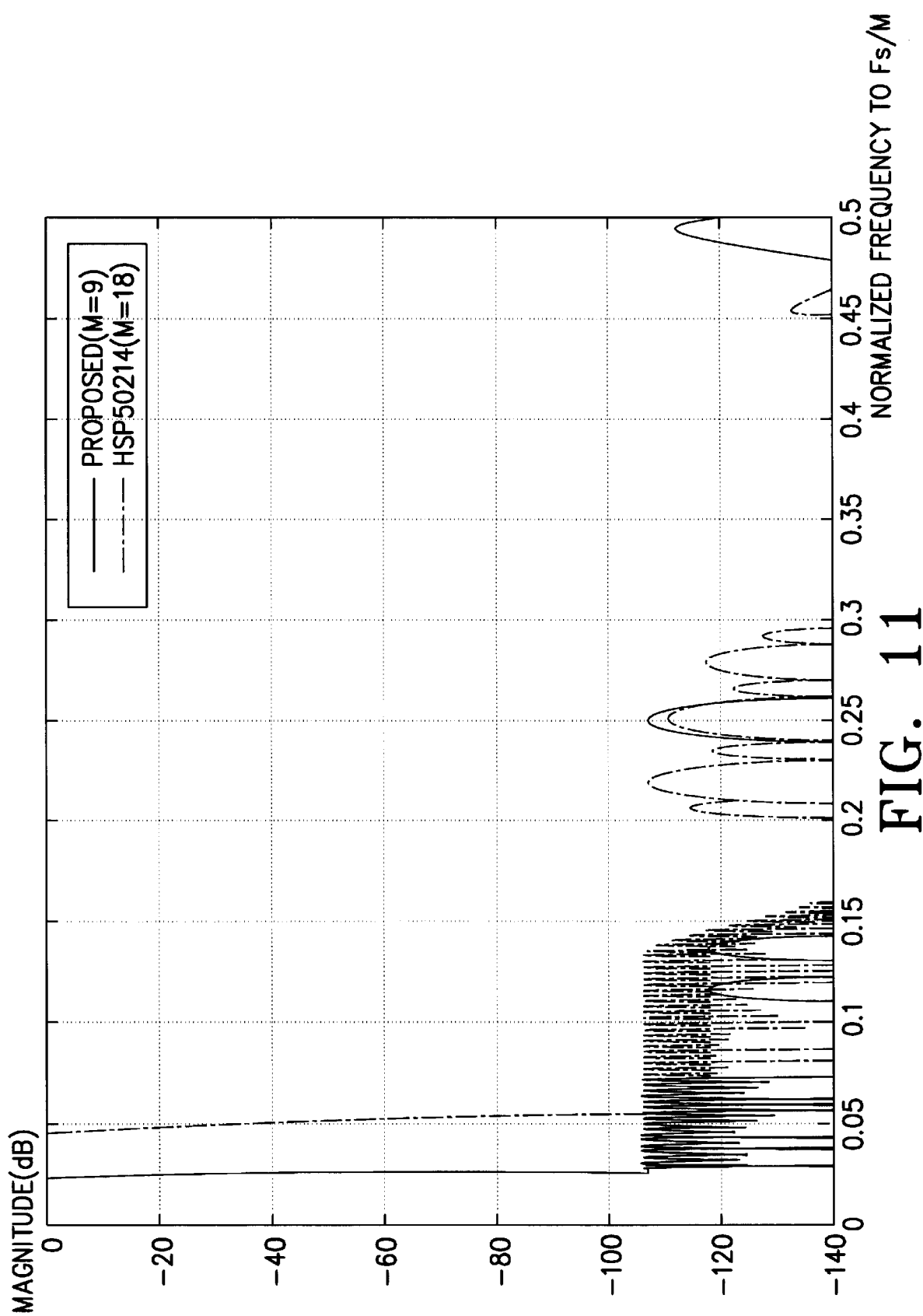
FIG. 11 is a diagram showing a first example of magnitude response characteristics of a downconverter according to an embodiment of the present invention.

FIG. 11 shows the magnitude responses of the overall decimation filter according to the present invention and the overall decimation filter according to the first prior art. Computational complexities required for implementing the overall filters are compared in Table 3.

TABLE 3

|  | Example 1 | | Example 2 | |
| --- | --- | --- | --- | --- |
|  | HSP50214 Architecture | Invention | HSP50214 Architecture | Invention |
| Multiplications | 57 | 36 | 48 | 27 |
| Additions | 119 | 134 | 99 | 104 |
| Delays | 135 | 150 | 115 | 102 |

The proposed structure reduced 21 multiplications at the expense of 15 additions and 15 delays.

EXAMPLE 2

A desirable sampling frequency for IS-95 is $F_s$=49.152 Msps which is 40 times the chip rate 1.2288M chips/sec. Assuming that the desired output rate of the PFIR filter 57 is two times the chip rate, it is set that D=20. The passband and stopband specifications of the overall decimation filter are determined based on those of a commercially available analog IF filter which is being used for IS-95 systems. Specifically, a filter disclosed in Part Number 854550-1 Data Sheet, Sawket Inc., 1997 is considered with the following specifications:

passband edge: 630 KHz from the carrier passband ripple: 0.7 dB stopband: 35 dB attenuation at 750 KHz from the carrier (19)

50 dB attenuation at 900 KHz from the carrier
Specifications in normalized frequencies are:

passband: $f \in [0, 0.0128]$ stopband: $f \in [0.0153, 0.5]$ passband ripple: 0.2 dB (20)

stopband attenuation: 80 dB

Here, 0.0128 and 0.0153 correspond to 630 KHz and 750 KHz, respectively. The specifications in equation (20) are considerably more stringent than those in equation (19). Two decimation filters, the proposed and the HSP50214-based filters, are designed under the specifications in equation (20). The procedure for designing these filters is summarized below.

Proposed Filter Design

Since D=20=$2^2$×5, then m≦2. Among the five MHBFs, MHBF1 and MHBF4 which meet equation (12) for m=2 are selected, and M is set to 5 (M=5). Again, MHBF5 was used as a prefilter. The CIC filter with L=4 and R=1 was chosen. This CIC filter provides 91.4 dB aliasing attenuation. The optimization in equation (14) was solved, as in Example 1. In this case, the design time was about an hour. The optimum (k,c) are given by (7,−2.2241). The resulting PFIR filter 57 has 51 taps, which are odd symmetric.

HSP50214-based Design

Among the five halfband filters, the third and the fifth ones which meet equation (12) for m=2 was selected. The CIC filter with M=5, L=4 and R=1 was chosen. The PFIR filter 57 was designed by solving an optimization problem which is similar to the one in equation (14). The resulting PFIR filter 57 has 72 taps, which are even symmetric.

Figure 12:
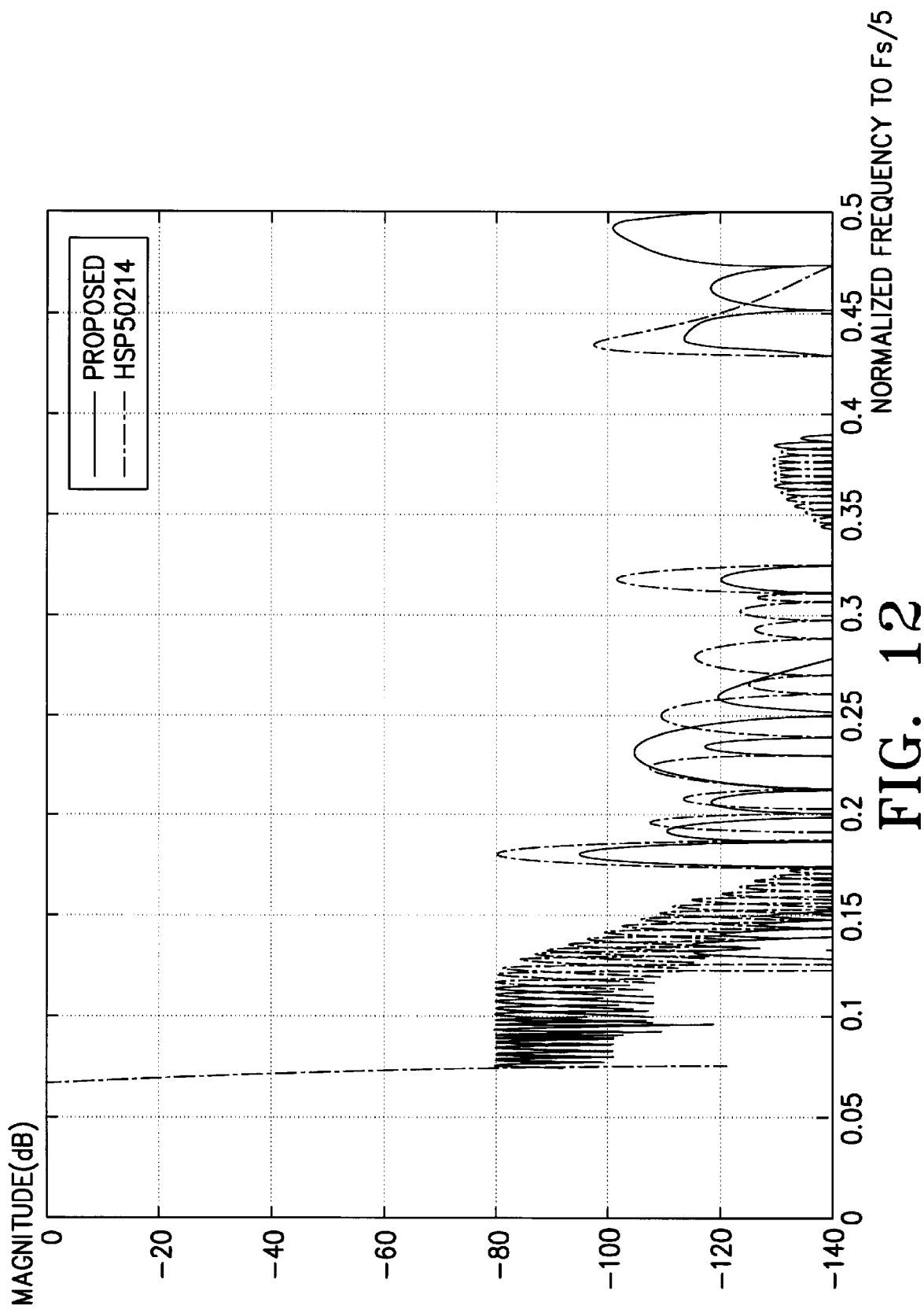
FIG. 12 is a diagram illustrating magnitude response characteristics of a downconverter for an IS-95 system.

FIG. 12 shows the magnitude responses of the two overall decimation filters. From Table 3, comparing their computational complexities, it can be seen that the proposed filter reduced 21 multiplications and 13 delays at the expense of 5 additions.

Now, reference will be made to the characteristic of the decimation filter according to the present invention. First, the characteristic of the decimation filter consisting of the CIC filter and the ISOP filter will be described. Second, the characteristic of the decimation filter consisting of the ISOP filter and the MHBF filter will be described. Third, the characteristic of the decimation filter consisting of the CIC filter, the ISOP filter and the MHBF filter will be described. Fourth, the characteristic of the decimation filter consisting of the CIC filter, the ISOP filter, the MHBF filter and the programmable FIR filter will be described.

Figure 13:
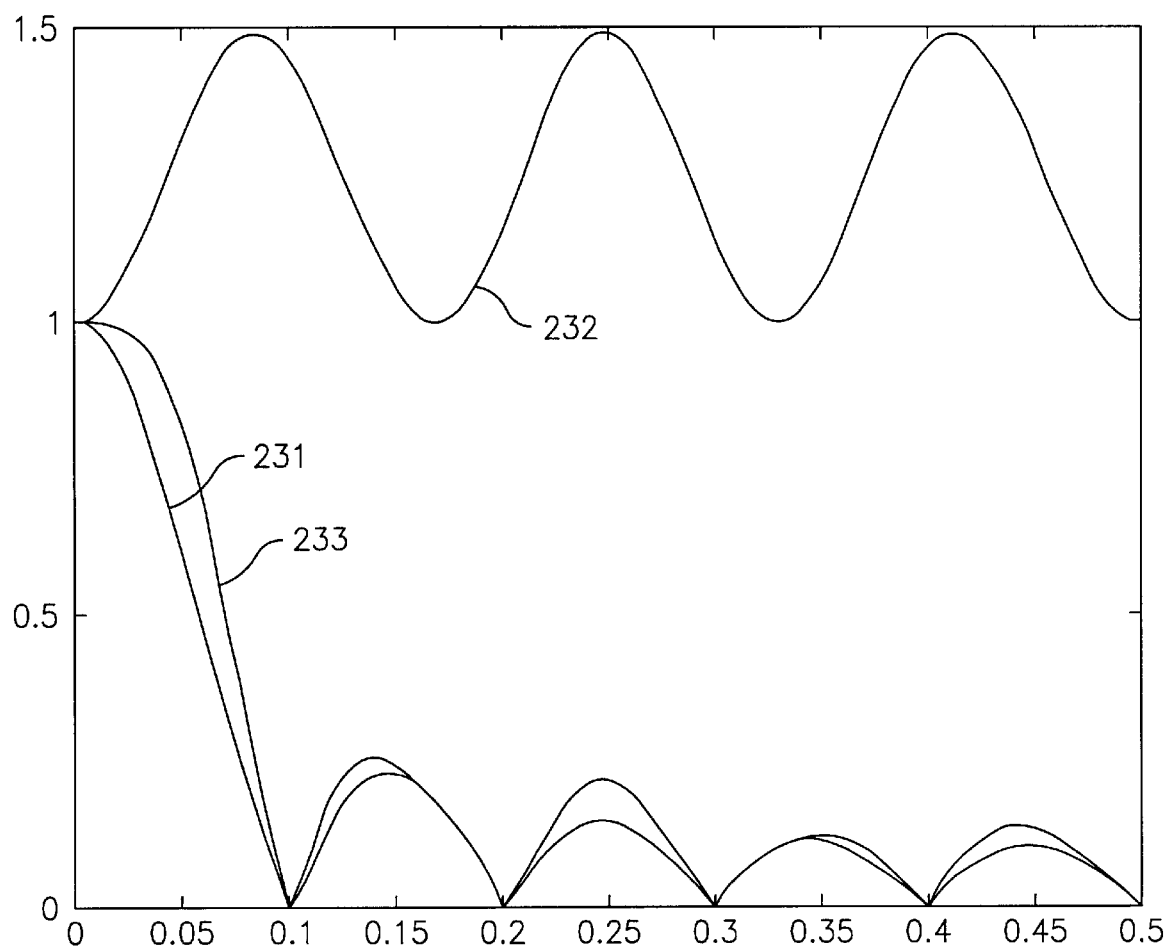
FIG. 13 is a diagram illustrating simulation results of a decimation filter consisting of a CIC decimation filter and an ISOP filter according to an embodiment of the present invention.

First, FIG. 13 shows the characteristic of the decimation filter consisting of the CIC filter 51 and the ISOP filter 53. In FIG. 13, reference numeral 231 denotes a characteristic curve of the CIC filter 51, reference numeral 232 denotes a characteristic curve of the ISOP filter 53, and reference numeral 233 denotes a characteristic curve of the decimation filter consisting of the CIC filter 51 and the ISOP filter 232. Here, the characteristic curve of the decimation filter should have the minimized ripple in order not to droop the signal when the sampling frequency fs is 1.0 and a signal band occupied by a signal of interest is 0.02 (20/1000), and to satisfy this, the ISOP is used. In FIG. 13, an X-axis is a frequency axis representing fs/2 and a Y-axis represents a magnitude of the signal in a linear scale.

Figure 14:
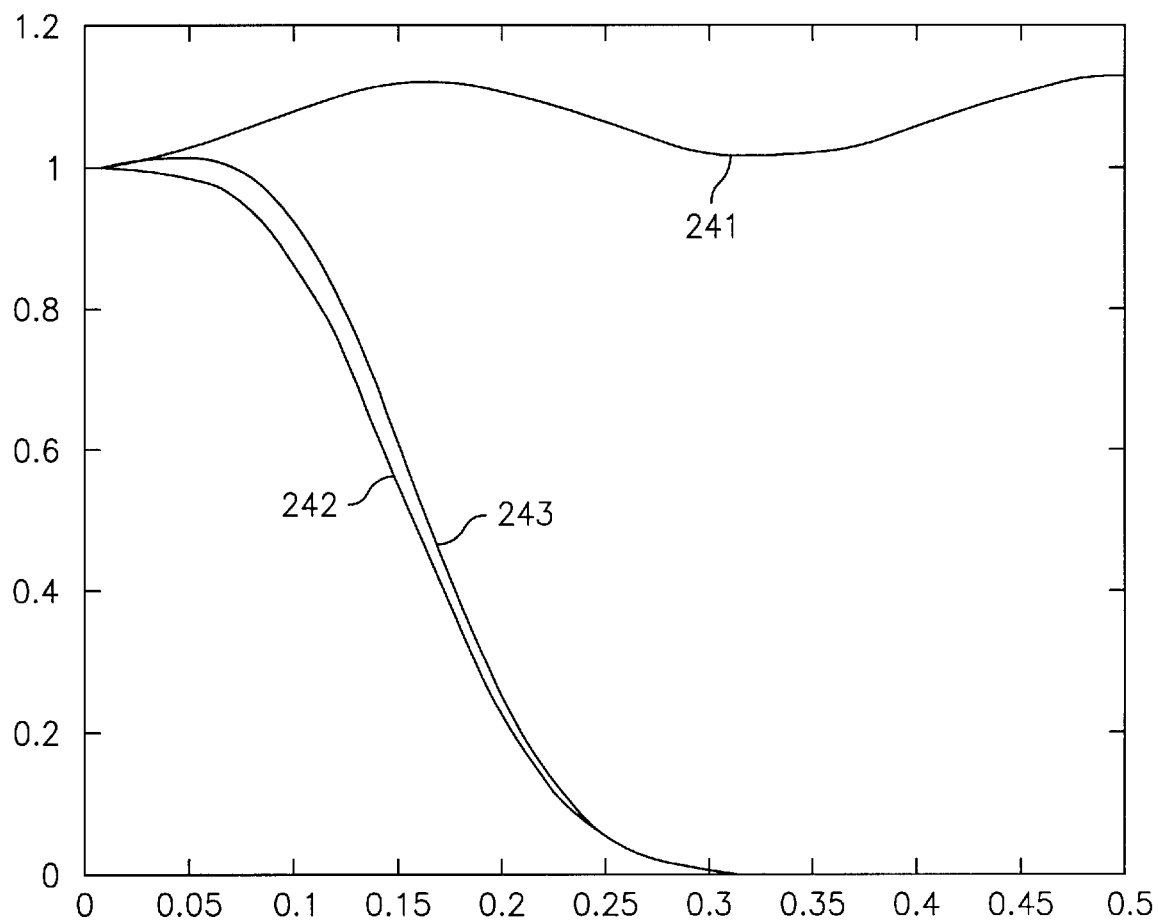
FIG. 14 is a diagram illustrating simulation results of a decimation filter consisting of an ISOP filter and a modified halfband filter (MHBF) according to an embodiment of the present invention.

Second, FIG. 14 shows the characteristic of the decimation filter consisting of the ISOP filter 53 and the MHBF filter. In FIG. 14, reference numeral 241 denotes a characteristic curve of the ISOP filter 53, reference numeral 242 denotes a characteristic curve of the MHBF filter, and reference numeral 243 denotes a characteristic curve of the decimation filter consisting of the ISOP filter 53 and the MHBF filter. Here, the characteristic curve of the decimation filter should have the minimized ripple in order not to droop the signal when the sampling frequency fs is 1.0 and the signal band occupied by the signal of interest is 0.07 (70/1000), and to satisfy this, the ISOP is used. In FIG. 14, an X-axis is a frequency axis representing fs/2 and a Y-axis represents a magnitude of the signal in a linear scale.

Figure 15:
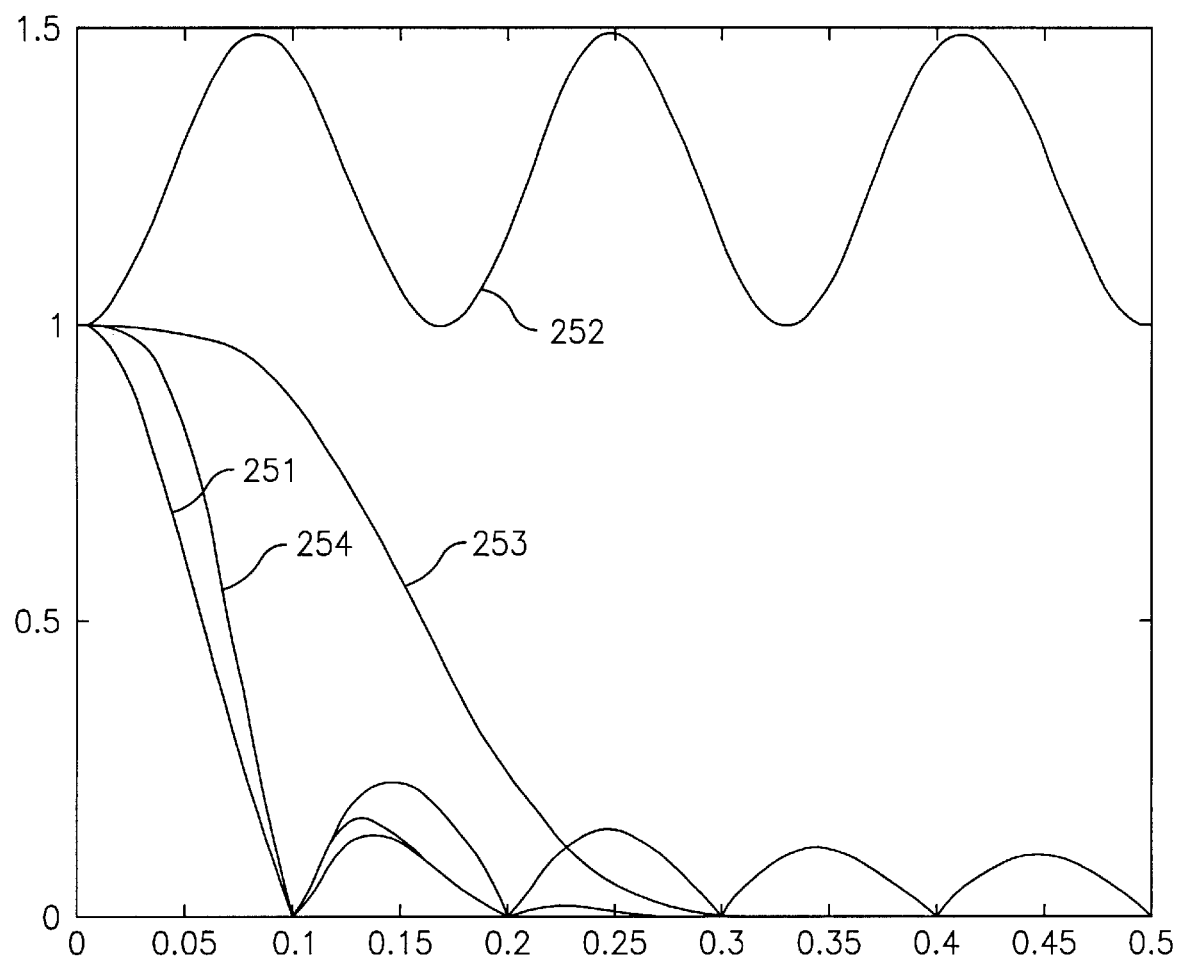
FIG. 15 is a diagram illustrating simulation results of a decimation filter consisting of a CIC filter, an ISOP filter and an MHBF according to an embodiment of the present invention.

Third, FIG. 15 shows the characteristic of the decimation filter consisting of the CIC filter 51, the ISOP filter 53 and the MHBF filter. In FIG. 15, reference numeral 251 denotes a characteristic curve of the CIC filter 51, reference numeral 252 denotes a characteristic curve of the ISOP filter 53, reference numeral 253 denotes a characteristic curve of the MHBF filter, and reference numeral 254 denotes a characteristic curve of the decimation filter consisting of the CIC filter 51, the ISOP filter 53 and the MHBF filter. Here, the characteristic curve of the decimation filter should have the minimized ripple in order not to droop the signal when the sampling frequency fs is 1.0 and the signal band occupied by the desired signal is 0.02 (40/2000), and to satisfy this, the ISOP is used. In FIG. 15, an X-axis is a frequency axis representing fs/2 and a Y-axis represents a magnitude of the signal in a linear scale.

Figure 16:
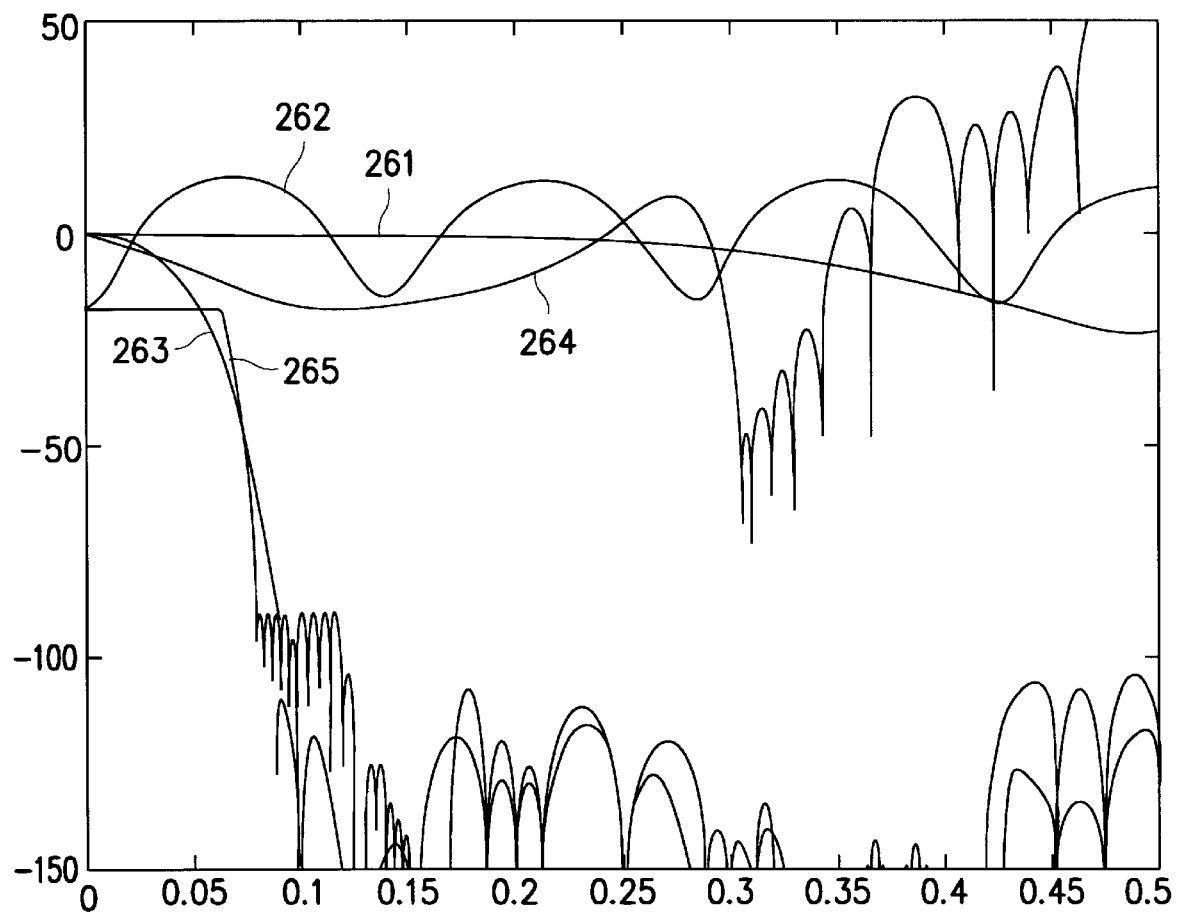
FIG. 16 is a diagram illustrating simulation results of a decimation filter consisting of a CIC filter, an ISOP filter, an MHBF and a programmable FIR filter.

Fourth, FIG. 16 shows the characteristic of the decimation filter consisting of the CIC filter 51, the ISOP filter 53, the MHBF filter and the programmable FIR filter 57. In FIG. 16, reference numeral 261 denotes a characteristic curve of the CIC filter 51, reference numeral 262 denotes a characteristic curve of the ISOP filter 53, reference numeral 263 denotes a characteristic curve of the MHBF filter, reference numeral 264 denotes a characteristic curve of the programmable FIR filter 57, and reference numeral 265 denotes a characteristic curve of the decimation filter consisting of the CIC filter 51, the ISOP filter 53, the MHBF filter and the programmable FIR filter 57. Here, by using the ISOPfilter 53, the decimation filter is so designed to have the ripple blow 0.07 are the attenuation –80 dB. In FIG. 16, an X-axis is a frequency axis representing fs/2 and a Y-axis represents a magnitude of the signal in a dB scale.

Heretofore, a description has been given of a novel CIC-based decimation filter employing an ISOP. It is noted that the ISOPs are very useful for reducing the computational complexity of the decimation filters. An interesting topic for further research is to find some other polynomials that can outperform ISOPs. Examination of some higher order polynomials such as even symmetric third order polynomials would lead to another class of polynomials which is useful for the CIC-based decimation filter.

In contrast to most wireless communication systems which employ digital signal processing (DSP) only at baseband, systems with the software radio usually start DSP at an IF band. By using programmable DSP chips at IF band as well as at baseband, software radio systems are very flexible and can efficiently support multi-band and multi-standard communications. The input to an IF stage of a software radio receiver is in general a very wideband signal, which is converted into a digital signal by bandpass sampling. The purpose of DSP at this stage is to isolate the signal of interest, which is usually a very narrowband signal, from a wideband input and to translate the signal down to the baseband.

Figure 17:
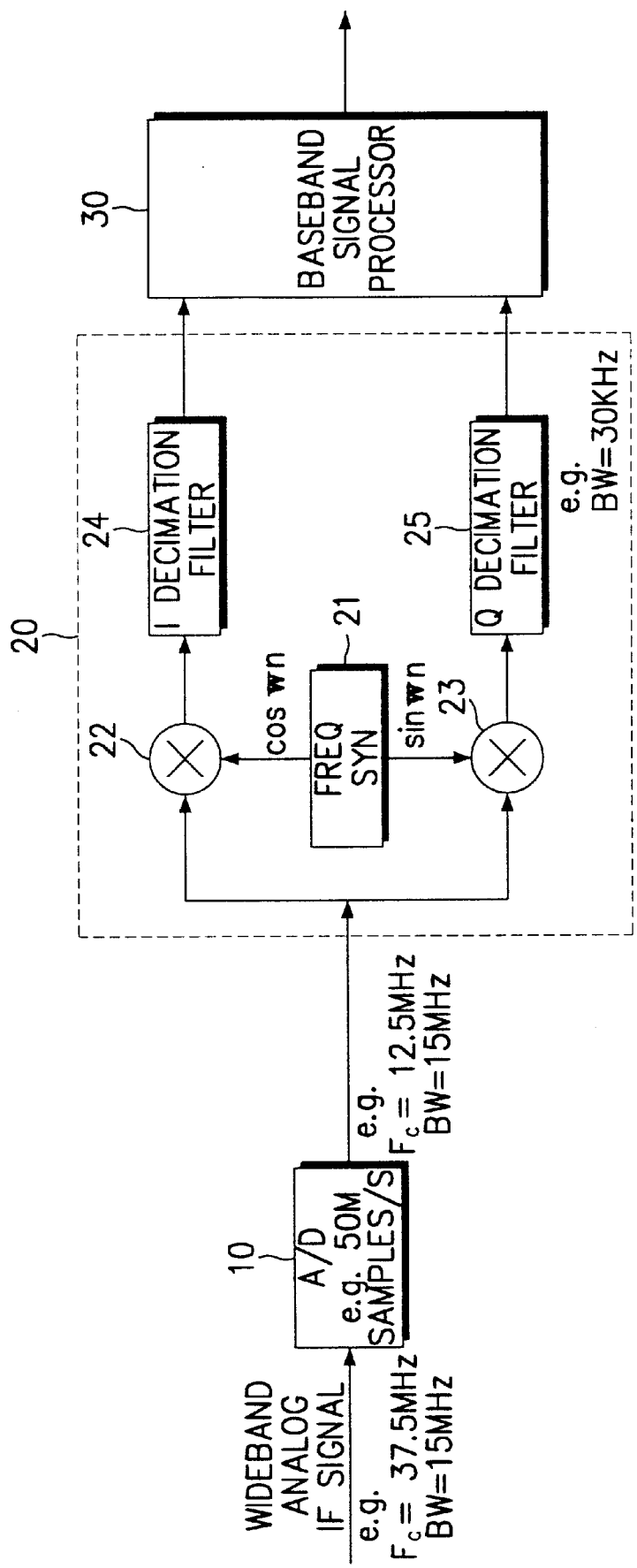
FIG. 17 is a diagram illustrating a structure of a software radio receiver employing a programmable downconverter.

For example, in a software radio receiver illustrated in FIG. 17, an analog input to an IF stage is a wideband signal with bandwidth BW=15 MHz and center frequency Fc=37.5 MHz. After 50M samples/sec (sps) bandpass sampling by a bandpass sampler 10, the center frequency of the digital signal corresponds to 12.5 MHz. This signal is passed through a programmable downconverter 20 (PDC) consisting of digital mixers 22 and 23 cascaded with associated decimation filters 24 and 25. Specifically, the digital signal output from the sampler 10 is applied to the programmable downconverter 20. The mixer 22 then mixes the digital signal with a frequency cosωn output from a digital frequency synthesizer 21 to convert the digital signal to I channel data, and a mixer 23 mixes the digital signal with a frequency sinωn output from the digital frequency synthesizer 21 to convert the digital signal to Q channel data. Then, an I channel decimator 24 decimates the I channel data to output an I channel baseband signal, and a Q channel decimator 25 decimates the Q channel data to output a Q channel baseband signal. That is, the programmable downconverter translates the signal down to the baseband, isolates a narrowband signal centered around DC and decimates it to lower the output sampling rate.

In the software radio system, it is very important to effectively design the decimation filters 24 and 25, because the input sampling rate of the filters is very high and their passband and transition bandwidth are extremely narrow. For example, again referring to FIG. 17, if the signal of interest has a passband 30 KHz and a sampling rate 50 Msps, then the passband width of the decimation filters 24 and 25 is $0.6 \times 10^{-3}$ in normalized frequency. Accordingly, by using the novel decimation filter, it is possible to effectively implement the programmable downconverter for the software radio system.

As described above, by employing the ISOP in addition to the programmable FIR filter for compensating for the passband droop caused by the CIC filter, it is possible to reduce the complexity of the halfband filter and the programmable FIR filter at the final stage. Furthermore, it is possible to simply implement the overall downconverter by employing the modified halfband filter in place of the halfband filter which is generally used for the property of the ISOP. In addition, since the modified halfband filter is implemented by using the multiplexers, the modified halfband filter may be used as the prefilter of the programmable FIR filter when it is not used.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A decimation filtering apparatus for decimating a sampling signal of a digital signal processing system, comprising:

a Cascaded Integrator-Comb (CIC) decimation filter for decimation filtering the sampling signal to downconvert the sampling signal; and an Interpolated Second Order Polynomial (ISOP) filter for monotonically increasing an output of the CIC decimation filter to compensate for a passband droop caused by the CIC decimation filter.

2. The decimation filtering apparatus as claimed in claim 1, wherein said CIC decimation filter comprises:

an integrator for integrating a sampling frequency with $1/(1-z^{-1})^L$;

a decimator for decimating an output of the integrator by a decimation factor M; and a comb filter for comb filtering an output of the decimator by $(1-z^{-R})^L$;

wherein said CIC decimation filter has a system function given by $$H(z) = \left( \frac{1}{MR} \frac{1-z^{-MR}}{1-z^{-1}} \right)^L$$

where M is an integer decimation factor, and R which is a differential delay is a positive integer.

3. The decimation filtering apparatus as claimed in claim 1, wherein said ISOP filter has a system function defined as $$P(z) = \frac{1}{|c+2|} (1 + cz^{-I} + z^{-2I})$$

where I is a positive integer and c is a real number which is a filtering coefficient varied by a decimation rate.

4. A decimation filtering apparatus for decimating a sampling signal of a digital signal processing system, comprising:

an ISOP filter for monotonically increasing the sampling signal to compensate in advance for a passband droop of a signal; and a modified halfband filter for half-decimating a signal output from the ISOP filter, with passband droop thereof compensated for by the ISOP filter.

5. The decimation filtering apparatus as claimed in claim 4, wherein said ISOP filter has a system function defined as $$P(z) = \frac{1}{|c+2|}(1 + cz^{-I} + z^{-2I})$$

where I is a positive integer and c is a real number which is a filtering coefficient varied by a decimation rate.

6. The decimation filtering apparatus as claimed in claim 4, wherein said modified halfband filter has a specification given by passband: $f \in [0, f_p]$ stopband: $f \in [0.5-f_p, 0.5]$ ripple: $\delta_1$ and $\delta_2$ for passband and stopband, respectively. $\delta_1 \gg \delta_2$ condition: magnitude response is monotonically decreasing in passband.

7. A decimation filtering apparatus for decimating a sampling signal of a digital signal processing system, comprising:

a CIC decimation filter for decimation filtering the sampling signal to downconvert the sampling signal;

an ISOP filter for monotonically increasing an output of the CIC decimation filter to compensate for a passband droop caused by the CIC decimation filter; and a modified halfband filter for half-decimating a signal output from the ISOP filter, with passband droop thereof compensated for by the ISOP filter.

8. The decimation filtering apparatus as claimed in claim 7, wherein said CIC decimation filter comprises:

an integrator for integrating a sampling frequency with $1(1-z^{-1})^L$;

a decimator for decimating an output of the integrator by a decimation factor M; and a comb filter for comb filtering an output of the decimator by $(1-z^{-R})^L$;

wherein said CIC decimation filter has a system function given by $$H(z) = \left(\frac{1}{MR}\frac{1-z^{-MR}}{1-z^{-1}}\right)^L$$

where M is an integer decimation factor, and R is a positive integer representing a differential delay.

9. The decimation filtering apparatus as claimed in claim 7, wherein said ISOP filter has a system function defined as $$P(z) = \frac{1}{|c+2|}(1 + cz^{-I} + z^{-2I})$$

where I is a positive integer and c is a real number which is a filtering coefficient varied by a decimation rate.

10. The decimation filtering apparatus as claimed in claim 7, wherein said modified halfband filter has a specification given by:

passband: $f \in [0, f_p]$ stopband: $f \in [0.5-f_p, 0.5]$ ripple: $\delta_1$ and $\delta_2$ for passband and stopband, respectively. $\delta_1 \gg \delta_2$ condition: magnitude response is monotonically decreasing in passband.

11. A decimation filtering apparatus for decimating a sampling signal of a digital signal processing system, comprising:

a Cascaded Integrator-Comb (CIC) decimation filter for decimation filtering the sampling signal to downconvert the sampling signal;

an Interpolated Second Order Polynomial (ISOP) filter for monotonically increasing an output of the CIC decimation filter to compensate for a passband droop caused by the CIC decimation filter;

a multistage halfband filter including at least one modified halfband filter for ½ decimating a signal output from the ISOP filter, said multistage halfband filter decimating the signal output from the ISOP filter to downconvert the signal; and a programmable Finite Impulse Response (FIR) filter for compensating for a passband droop of a signal output from the multistage halfband filter.

12. The decimation filtering apparatus as claimed in claim 11, wherein said CIC decimation filter comprises:

an integrator for integrating a sampling frequency with $1/(1-z^{-1})^L$;

a decimator for decimating an output of the integrator by a decimation factor M; and a comb filter for comb filtering an output of the decimator by $(1-z^{-R})^L$;

wherein said CIC decimation filter has a system function given by $$H(z) = \left(\frac{1}{MR}\frac{1-z^{-MR}}{1-z^{-1}}\right)^L$$

where M is an integer decimation factor, and R is an positive integer representing a differential delay.

13. The decimation filtering apparatus as claimed in claim 11, wherein said ISOP filter has a system function defined as $$P(z) = \frac{1}{|c+2|}(1 + cz^{-I} + z^{-2I})$$

where I is a positive integer and c is a real number which is a filtering coefficient varied by a decimation rate.

14. The decimation filtering apparatus as claimed in claim 11, wherein said modified halfband filter has a specification given by:

passband: $f \in [0, f_p]$ stopband: $f \in [0.5-f_p, 0.5]$ ripple: $\delta_1$ and $\delta_2$ for passband and stopband, respectively. $\delta_1 \gg \delta_2$ condition: magnitude response is monotonically decreasing in passband.

15. The decimation filtering apparatus as claimed in claim 11, wherein said halfband filter comprises:

a modified halfband filter with a fixed coefficient, for halfband filtering an input signal;

a decimator for ½ decimating an output of the modified halfband filter, and a multiplexer for multiplexing outputs of the modified halfband filter and the decimator.

16. A decimation filtering apparatus for decimating a sampling signal of a digital signal processing system, comprising:

a Cascaded Integrator-Comb (CIC) decimation filter for decimation filtering the sampling signal to downconvert the sampling signal;

an Interpolated Second Order Polynomial (ISOP) filter for monotonically increasing an output of the CIC decimation filter to compensate for a passband droop caused by the CIC decimation filter;

a multistage halfband filter including at least one modified halfband filter for ½ decimating a signal output from the ISOP filter, said multistage halfband filter decimating the signal output from the ISOP filter to downconvert the signal;

a programmable FIR filter for compensating for a passband droop of a signal output from the multistage halfband filter; and an interpolation filter for adjusting an output sampling rate of the programmable FIR filter to a predetermined frequency.

17. The decimation filtering apparatus as claimed in claim 16, wherein said CIC decimation filter comprises:

an integrator for integrating a sampling frequency with $1/(1-z^{-1})^L$;

a decimator for decimating an output of the integrator by a decimation factor M; and a comb filter for comb filtering an output of the decimator by $(1-z^{-R})^L$;

wherein said CIC decimation filter has a system function given by $$H(z) = \left( \frac{1}{MR} \frac{1-z^{-MR}}{1-z^{-1}} \right)^L$$

where M is an integer decimation factor, and R which is a differential delay is a positive integer.

18. The decimation filtering apparatus as claimed in claim 16, wherein said ISOP filter has a system function defined as $$P(z) = \frac{1}{|c+2|}(1+cz^{-I}+z^{-2I})$$

where I is a positive integer and c is a real number which is a filtering coefficient varied by a decimation rate.

19. The decimation filtering apparatus as claimed in claim 16, wherein said modified halfband filter has a specification given by passband: $f \in [0, f_p]$ stopband: $f \in [0.5-f_p, 0.5]$ ripple: $\delta_1$ and $\delta_2$ for passband and stopband, respectively. $\delta_1 >> \delta_2$ condition: magnitude response is monotonically decreasing in passband.

20. The decimation filtering apparatus as claimed in claim 16, wherein said halfband filter comprises:

a modified halfband filter with a fixed coefficient, for halfband filtering an input signal;

a decimator for ½ decimating an output of the modified halfband filter; and a multiplexer for multiplexing outputs of the modified halfband filter and the decimator.

21. A decimation filtering apparatus in a downconverter of a software radio system, comprising:

a first mixer for mixing a digital converted Intermediate Frequency (IF) signal with a sinusoidal signal output from a sinusoidal wave generator to generate an I channel sampling signal;

a first decimation filter for decimating an output of the first mixer to downconvert the output of the first mixer;

a second mixer for mixing an IF sampling signal with an output of the sinusoidal wave generator to generate a Q channel sampling signal;

a second decimation filter for decimating an output of the second mixer to downconvert the output of the second mixer; and a signal processor for processing outputs of the first and second decimation filters at baseband;

wherein each of said first and second decimation filters comprises:

a CIC decimation filter for decimation filtering the sampling signal to downconvert the sampling signal;

an ISOP filter for monotonically increasing an output of the CIC decimation filter to compensate for a passband droop caused by the CIC decimation filter;

a multistage halfband filter including at least one modified halfband filter for half-decimating a signal output by the ISOP filter, said multistage halfband filter decimating the signal output by the ISOP filter to downconvert the signal; and a programmable FIR filter for compensating for a passband droop of a signal output by the multistage halfband filter.

22. The decimation filtering apparatus as claimed in claim 21, wherein said CIC decimation filter comprises:

an integrator for integrating a sampling frequency with $1/(1-z^{-1})^L$;

a decimator for decimating an output of the integrator by a decimation factor M; and a comb filter for comb filtering an output of the decimator by $(1-z^{-R})^L$;

wherein said CIC decimation filter has a system function given by $$H(z) = \left( \frac{1}{MR} \frac{1-z^{-MR}}{1-z^{-1}} \right)^L$$

where M is an integer decimation factor, and R which is a differential delay is a positive integer.

23. The decimation filtering apparatus as claimed in claim 21, wherein said ISOP filter has a system function defined as $$P(z) = \frac{1}{|c+2|}(1+cz^{-I}+z^{-2I})$$

where I is a positive integer and c is a real number which is a filtering coefficient varied by a decimation rate.

24. The decimation filtering apparatus as claimed in claim 21, wherein said modified halfband filter has a specification given by:

passband: $f \in [0, f_p]$ stopband: $f \in [0-5-f_p, 0.5]$ ripple: $\delta_1$ and $\delta_2$ for passband and stopband, respectively. $\delta_1 >> \delta_2$ condition: magnitude response is monotonically decreasing in passband.

25. The decimation filtering apparatus as claimed in claim 21, wherein said halfband filter comprises:
- a modified halfband filter with a fixed coefficient, for halfband filtering an input signal;
- a decimator for ½ decimating an output of the modified halfband filter; and
- a multiplexer for multiplexing outputs of the modified halfband filter and the decimator.

26. A decimation filtering method comprising:
- a CIC decimation filtering step of decimating a sampling signal by $$H(z) = \left( \frac{1}{MR} \frac{1-z^{-MR}}{1-z^{-1}} \right)^L$$

to downconvert the sampling signal;
- an ISOP filtering step of monotonically increasing the CIC decimation filtered signal by $$P(z) = \frac{1}{|c+2|} (1 + cz^{-l} + z^{-2l})$$

to compensate for a passband droop caused by decimation;
- a multistage halfband filtering step of performing multiple halfband filtering operations of ½ decimating the input signal, to downconvert the ISOP filtered signal; and
- an FIR filtering step of compensating for a passband droop of the multistage halfband filtered signal.

27. A decimation filtering method comprising:
- a CIC decimation filtering step of decimating a sampling signal by $$H(z) = \left( \frac{1}{MR} \frac{1-z^{-MR}}{1-z^{-1}} \right)^L$$

to downconvert the sampling signal;
- an ISOP filtering step of monotonically increasing the CIC decimation filtered signal by $$P(z) = \frac{1}{|c+2|} (1 + cz^{-l} + z^{-2l})$$

to compensate for a passband droop caused by decimation;
- a multistage halfband filtering step of performing multiple halfband filtering operations of ½ decimating the input signal, to downconvert the ISOP filtered signal;
- an FIR filtering step of compensating for a passband droop of the multistage halfband filtered signal; and
- an interpolation filtering step of adjusting the FIR filtered signal to a predetermined frequency.

* * * * *